United States Patent [19]
Yamazaki et al.

[11] Patent Number: 6,147,375
[45] Date of Patent: *Nov. 14, 2000

[54] ACTIVE MATRIX DISPLAY DEVICE

[75] Inventors: Shunpei Yamazaki, Tokyo; Akira Mase, Aichi; Masaaki Hiroki, Kanagawa; Yasuhiko Takemura, Kanagawa; Hongyong Zhang, Kanagawa; Hideki Uochi, Kanagawa, all of Japan

[73] Assignee: Semiconductor Energy Laboratory Co., Ltd., Kanagawa, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 09/151,269

[22] Filed: Sep. 11, 1998

Related U.S. Application Data

[62] Division of application No. 08/455,156, May 31, 1995, Pat. No. 5,849,611, which is a division of application No. 08/014,455, Feb. 3, 1993, Pat. No. 5,485,019.

[30] Foreign Application Priority Data

Feb. 5, 1992 [JP] Japan ........................... 4-54322
Jan. 26, 1993 [JP] Japan ........................... 5-029744

[51] Int. Cl.[7] .................. H01L 27/108; H01L 29/76; H01L 29/94; H01L 31/119
[52] U.S. Cl. .................. 257/296; 257/350; 257/351; 257/369
[58] Field of Search ................ 257/382, 383, 257/384, 385, 412, 413, 758, 759, 760, 59, 71, 72, 296, 350, 351, 369

[56] References Cited

U.S. PATENT DOCUMENTS 3,634,203  1/1972  McMahon et al. .
3,798,135  3/1974  Bracken et al. ............... 205/124
3,855,112  12/1974  Tomozawa et al. ............ 437/236
3,864,217  2/1975  Takahata et al. .............. 205/124
4,003,772  1/1977  Hanazono et al. ............. 437/237
4,468,855  9/1984  Sasaki .

(List continued on next page.)

FOREIGN PATENT DOCUMENTS 0 072 216    2/1983   European Pat. Off. .
55-162224   12/1980   Japan ................ 438/FOR 184
58-2073      1/1983   Japan ................ 257/57
58-23478     2/1983   Japan .

(List continued on next page.)

OTHER PUBLICATIONS

Fukase et al., IEDM 1992 Proc., p. 837, "A margin–free contact process using an Al2O3 etch–stop . . . ", 1992.
IBM Technical Discl. Bulletin 34(10a)(1992)219, "Method for forming via hole formation", Mar. 1992.
J. Torkel Wallmark et al., "Field–Effect Transistors: Physics, Technology and Applications", (1968), pp. 199.
Richard S. C. Cobbold, "Theory and Applications of Field–Effect Transistors", (1971), (1 page).

(List continued on next page.)

*Primary Examiner*—Ngân V. Ngô
*Attorney, Agent, or Firm*—Nixon Peabody LLP; Jeffrey L. Costellia

[57] ABSTRACT

A wiring formed on a substrate is oxidized and the oxide is used as a mask for forming source and drain impurity regions of a transistor, or as a material for insulating wirings from each other, or as a dielectric of a capacitor. The thickness of the oxide is determined depending on the purpose of the oxide. In a transistor adapted to be used in an active-matrix liquid-crystal display, the channel length, the distance between the source region and the drain region, is made larger than the length of the gate electrode taken in the longitudinal direction of the channel. Offset regions are formed in the channel region on the sides of the source and drain regions. No or very weak electric fields are applied to these offset regions from the gate electrode.

44 Claims, 21 Drawing Sheets

▓▓ — FIRST LAYER WIRING (GATE WIRING AND SO ON)
▧▧ — SECOND LAYER WIRING
▨ — P-TYPE IMPURITY REGION
▓ — N-TYPE IMPURITY REGION
☐ — TRANSPARENT CONDUCTIVE FILM

U.S. PATENT DOCUMENTS

| | | |
|---|---|---|
| 4,528,480 | 7/1985 | Unagami et al. . |
| 4,617,193 | 10/1986 | Wu . |
| 4,618,878 | 10/1986 | Aoyama et al. . |
| 4,627,153 | 12/1986 | Masuoka ............................... 257/392 |
| 4,646,426 | 3/1987 | Sasaki . |
| 4,727,044 | 2/1988 | Yamazaki . |
| 4,767,724 | 8/1988 | Kim et al. . |
| 4,883,767 | 11/1989 | Gray et al. ............................... 437/41 |
| 4,905,066 | 2/1990 | Dohjo et al. . |
| 4,959,700 | 9/1990 | Yamazaki . |
| 5,109,267 | 4/1992 | Koblinger et al. . |
| 5,132,821 | 7/1992 | Nicholas .................................... 257/59 |
| 5,142,344 | 8/1992 | Yamazaki . |
| 5,158,910 | 10/1992 | Cooper et al. ........................... 437/195 |
| 5,240,868 | 8/1993 | Bae et al. ........................... 437/40 TFI |
| 5,270,236 | 12/1993 | Rosner ..................................... 437/52 |
| 5,308,998 | 5/1994 | Yamazaki et al. ...................... 438/163 |
| 5,313,077 | 5/1994 | Yamazaki . |
| 5,315,132 | 5/1994 | Yamazaki . |
| 5,359,206 | 10/1994 | Yamamoto et al. . |
| 5,422,293 | 6/1995 | Konya .................................... 437/195 |
| 5,510,294 | 4/1996 | Dixit et al. .............................. 437/195 |
| 5,521,107 | 5/1996 | Yamazaki et al. . |
| 5,543,636 | 8/1996 | Yamazaki . |
| 5,561,075 | 10/1996 | Nakazawa . |
| 5,580,825 | 12/1996 | Labunov et al. ........................ 437/237 |
| 5,770,469 | 6/1998 | Uram et al. ............................. 437/240 |

FOREIGN PATENT DOCUMENTS

| | | | |
|---|---|---|---|
| 58-23479 | 2/1983 | Japan . | |
| 58-27365 | 2/1983 | Japan . | |
| 63-126277 | 5/1983 | Japan . | |
| 58-105574 | 6/1983 | Japan . | |
| 58-106861 | 6/1983 | Japan . | |
| 58-115864 | 7/1983 | Japan . | |
| 58-118154 | 7/1983 | Japan . | |
| 58-164268 | 9/1983 | Japan . | |
| 58-192379 | 11/1983 | Japan . | |
| 59-21067 | 2/1984 | Japan . | |
| 59-63746 | 4/1984 | Japan ..................................... 437/235 |
| 60-245173 | 12/1985 | Japan . | |
| 60-245174 | 12/1985 | Japan . | |
| 61-181165 | 7/1986 | Japan ...................................... 257/59 |
| 61-231767 | 10/1986 | Japan ............................ 438/FOR 155 |
| 62-76545 | 3/1987 | Japan ...................................... 257/59 |
| 62-73658 | 4/1987 | Japan . | |
| 62-73660 | 4/1987 | Japan . | |
| 62-214669 | 9/1987 | Japan . | |
| 63-13347 | 1/1988 | Japan ..................................... 437/947 |
| 63-9978 | 1/1988 | Japan . | |
| 63-70832 | 3/1988 | Japan . | |
| 63-102265 | 5/1988 | Japan ............................ 438/FOR 201 |
| 63-178560 | 7/1988 | Japan . | |
| 63-219152 | 9/1988 | Japan . | |
| 63-219252 | 9/1988 | Japan . | |
| 64-89464 | 4/1989 | Japan . | |
| 1-158775 | 6/1989 | Japan ...................................... 257/57 |
| 1-183583 | 7/1989 | Japan ............................. 437/40 TFT |
| 1-183853 | 7/1989 | Japan ............................. 437/40 TFT |
| 1-194351 | 8/1989 | Japan . | |
| 1-274117 | 11/1989 | Japan . | |
| 1-296642 | 11/1989 | Japan ..................................... 437/944 |
| 2-51129 | 2/1990 | Japan . | |
| 2-133941 | 5/1990 | Japan ..................................... 437/981 |
| 2-159730 | 6/1990 | Japan . | |
| 2-228041 | 9/1990 | Japan . | |
| 2-228042 | 9/1990 | Japan . | |
| 3-165575 | 7/1991 | Japan . | |
| 3-185735 | 8/1991 | Japan ............................ 438/FOR 201 |
| 3-217059 | 9/1991 | Japan . | |
| 3-272183 | 9/1991 | Japan ...................................... 257/59 |
| 4-273215 | 9/1992 | Japan . | |
| 4-299864 | 10/1992 | Japan . | |
| 4-360580 | 12/1992 | Japan . | |
| 5-267667 | 10/1993 | Japan . | |

OTHER PUBLICATIONS

C. W. Wilmsen, "Chemical Composition and Formation of Thermal and Anodic Oxide/III–V Compound Semiconductor Interfaces", J. Vac. Sci. Technol., vol. 13, No. 3, Sep. – Oct. 1981, pp. 279–287.

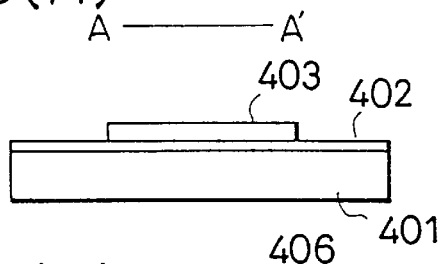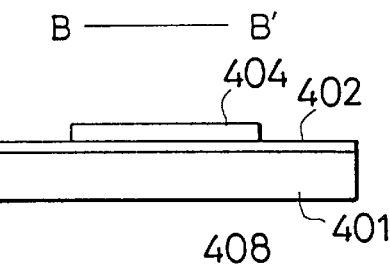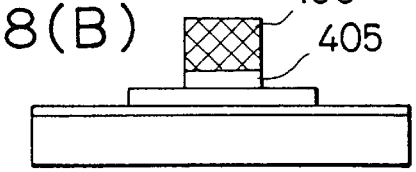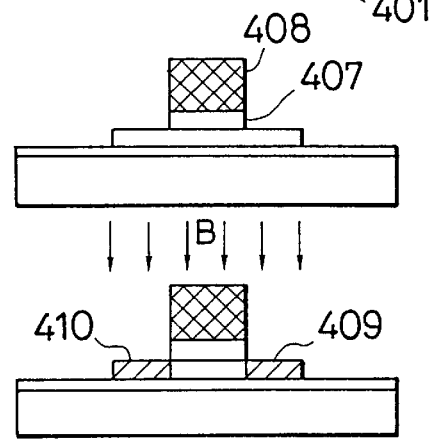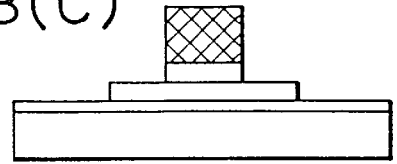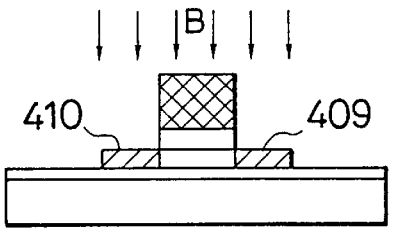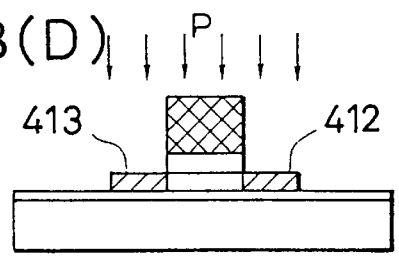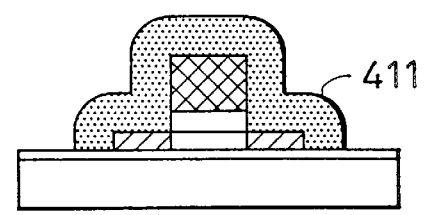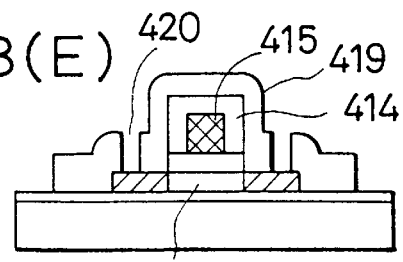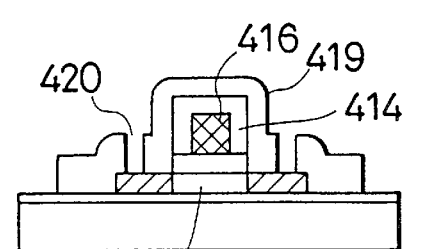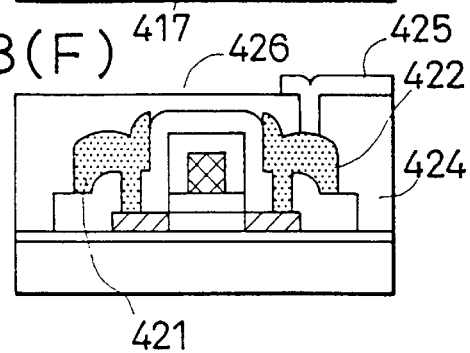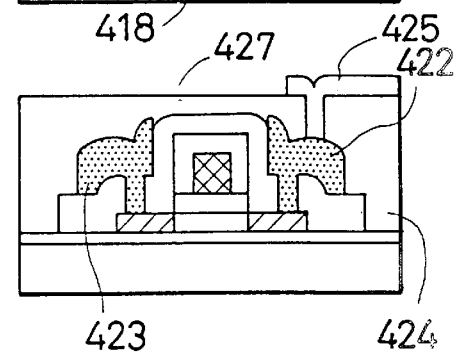

FIG. 9
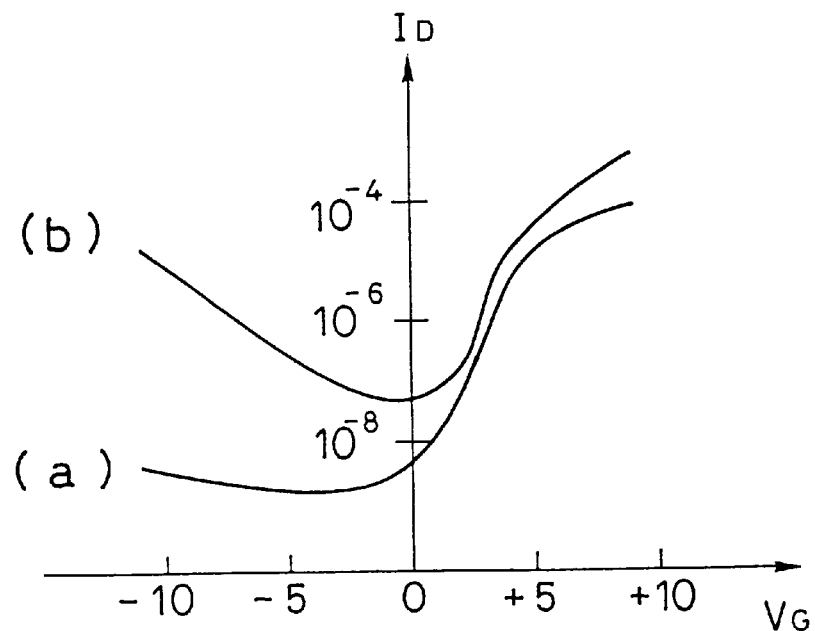
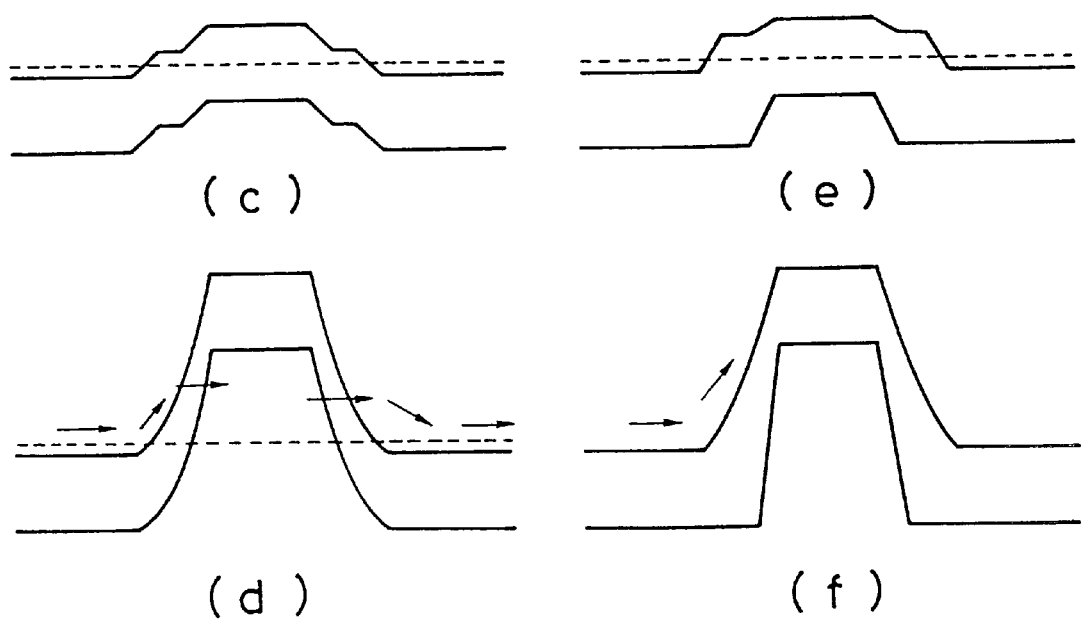

FIG. 10(A)
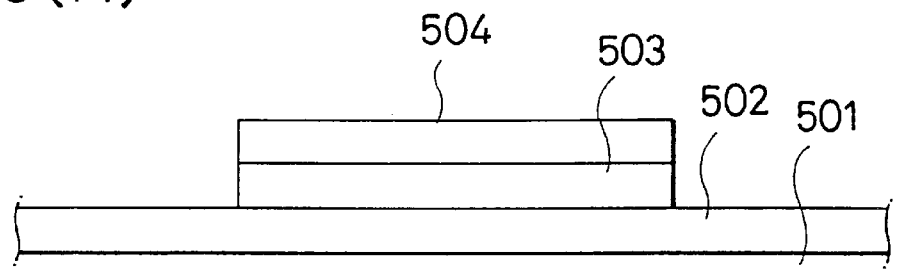
FIG. 10(B)
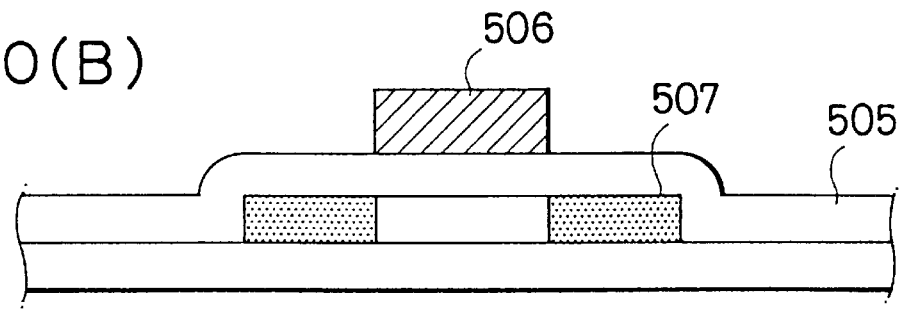
FIG. 10(C)
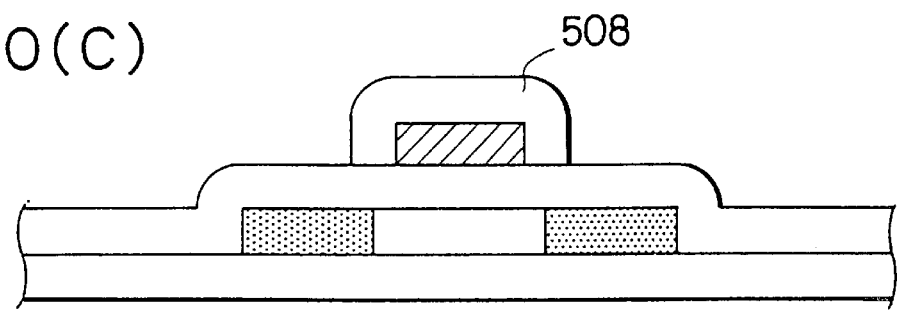
FIG. 10(D) LASER LIGHT
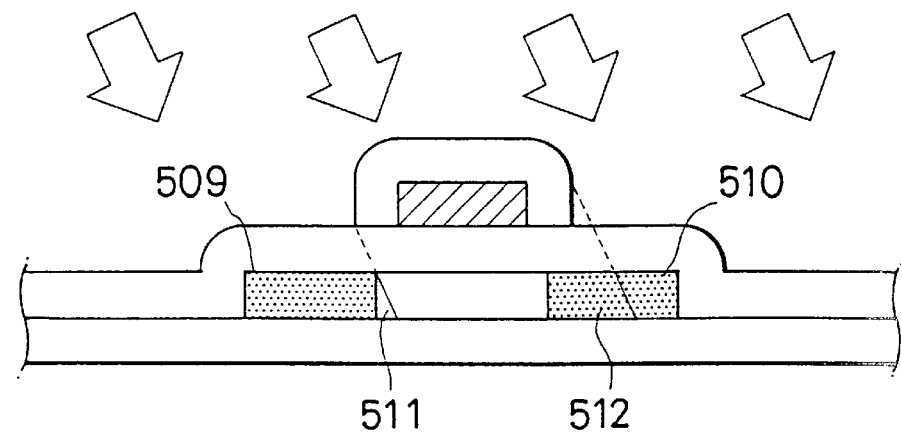

FIG. 14
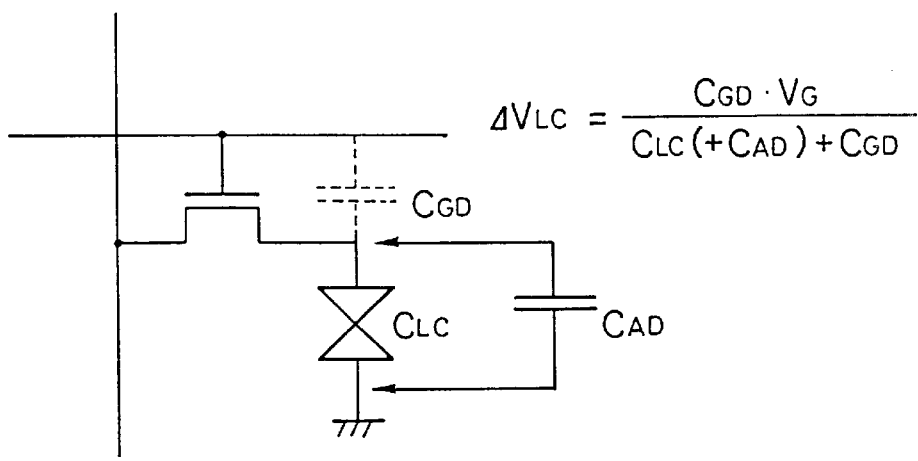
$$\Delta V_{LC} = \frac{C_{GD} \cdot V_G}{C_{LC}(+C_{AD})+C_{GD}}$$
(A)
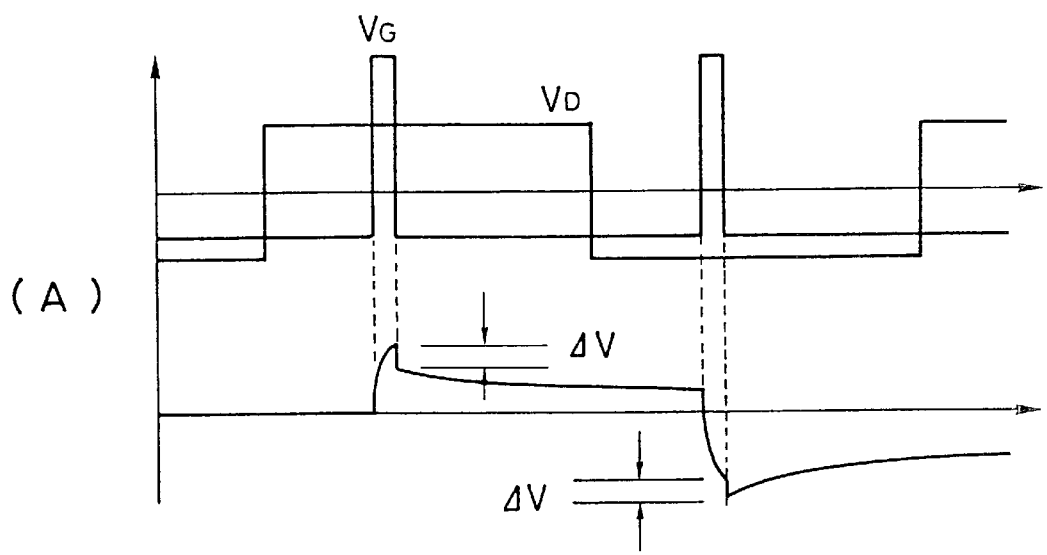
(B)
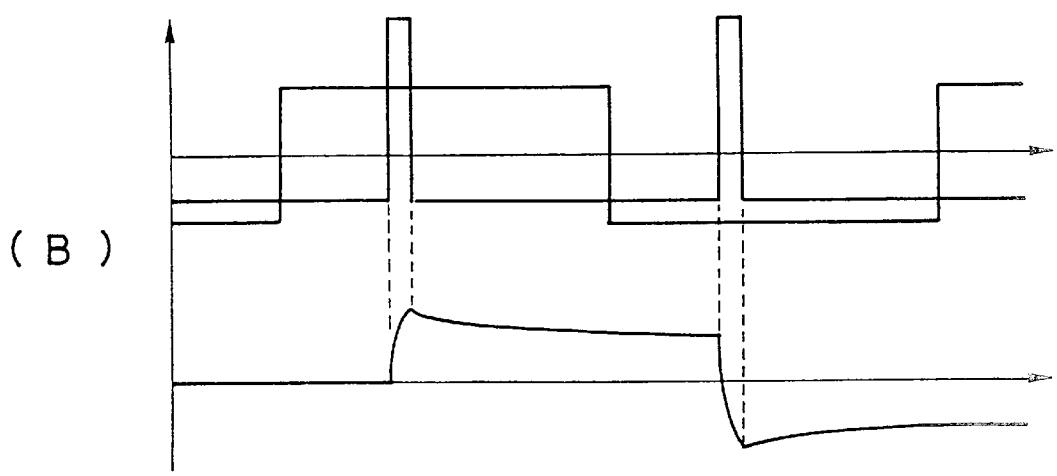

▨ — FIRST LAYER WIRING (GATE WIRING AND SO ON)
▧ — SECOND LAYER WIRING
▤ — P-TYPE IMPURITY REGION
▦ — N-TYPE IMPURITY REGION
▨ — TRANSPARENT CONDUCTIVE FILM

ACTIVE MATRIX DISPLAY DEVICE

This application is a Divisional of application Ser. No. 08/455,156, filed May 31, 1995, now U.S. Pat. No. 5,849, 611, which is a Divisional of application Ser. No. 08/014, 455, filed Feb. 3, 1993, now U.S. Pat. No. 5,485,019.

FIELD OF THE INVENTION

The present invention relates to a semiconductor device, semiconductor integrated circuit such as an insulating gate field-effect translator and a manufacturing method thereof.

Particularly, the present invention relates to an active-matrix electro-optical device and, more particularly, to a field-effect transistor which can be applied to an active-matrix liquid-crystal electro-optical device or the like and has definite switching characteristics. Also, the invention relates to a method of fabricating such a field-effect transistor.

BACKGROUND OF THE INVENTION

The prior art thin-film insulated-gate field-effect transistor used in an active-matrix liquid-crystal electro-optical device is constructed as shown in FIG. 2. A blocking layer 208 is formed on an insulating substrate 209. A semiconductor layer having a source 204, a drain 205, and a channel region 203 is formed on the blocking layer 208. A gate-insulating film 202 and a gate electrode 201 are laminated on the semiconductor layer. An interlayer insulating film 211 is formed on the gate-insulating film 202 and on the gate electrode 201. A source electrode 206 and a drain electrode 207 are formed on the interlayer insulating film 211 and on the semiconductor layer.

This prior art insulated-gate FET is manufactured in the sequence described now. First, the blocking layer 208 is formed on the glass substrate 209 by sputtering while using $SiO_2$ as a target. Then, the semiconductor layer is formed by plasma-assisted CVD and patterned to form the semiconductor layer which will have the source, drain, and channel region. Then, silicon oxide is sputtered to form the gate-insulating film 202. Subsequently, an electrically conductive layer which is heavily doped with phosphorus and used to form the gate electrode is formed by low-pressure CVD. The conductive layer is than patterned to form the gate electrode 201. Thereafter, dopant ions are implanted while using the gate electrode as a mask, so that the source 205 and the drain 204 are fabricated. Then, the laminate is thermally treated to activate it.

In the insulated-gate FET fabricated in this way, the length of the gate electrode 201 taken in the longitudinal direction of the channel is substantially identical with the channel length, indicated by 210. In the case of the n-channel structure, the current-voltage characteristic of the FET of this structure is shown in FIG. 3. This FET has the disadvantage that in the reverse bias region 250, the leakage current increases with increasing the voltage applied between the source and drain. Where this device is used in an active-matrix liquid-crystal electro-optical device, if the leakage current increases in this way, the electric charge stored in a liquid crystal 302 by a writing current 300 is discharged as a leakage current 301 through the leaking portion of the device during the non-writing period, as shown in FIG. 5(A). In this manner, it has been impossible to obtain good contrast.

A conventional method of solving this problem is to add a capacitor 303 for holding electric charge, as shown in FIG. 5(B). However, in order to form such capacitors, capacitive electrodes made of metal interconnects are needed. This results in a decrease in the aperture ratio. Also, it is reported that the aperture ratio is improved by fabricating the capacitors from transparent electrodes of ITO. Nonetheless, this scheme necessitates an excess process and hence has not enjoyed popularity.

Where only one of the source and drain of this insulated-gate FET is connected with a capacitive device or a capacitor and this transistor is used as a switching device, e.g., in the case of a well-known dynamic random access memory (DRAM) of the 1 transistor/cell type or in the case of an active liquid crystal display having pixels each of which has the circuit shown in FIG. 5(A) or 5(B), it is known that the voltage at the capacitor device is varied by the existence of a parasitic capacitance between the gate electrode and the drain or source.

The variation $\Delta V$ in this voltage is in proportion to the gate voltage $V_G$ and to the parasitic capacitance and is in inverse proportion to the sum of the capacitance of the capacitive device and the parasitic capacitance. Therefore, it is customary to fabricate the transistor by the self-aligning technology to reduce the parasitic capacitance, thus suppressing variations in the voltage. However, as the dimensions of devices decrease, the contribution of the parasitic capacitance becomes so large that it can no longer be neglected even if the self-aligning process is exploited.

In an attempt to reduce the variation $\Delta V$, a new method has been proposed. In particular, as shown in FIG. 5(B), a capacitor other than the proper capacitive device is connected in parallel to increase the apparent capacitance of the capacitive device. As described previously, however, the increase in the area of the capacitor cannot be neglected for DRAMs. The decrease in the numerical aperture cannot be neglected for liquid-crystal displays.

Conventionally, a conductive material in single-layers or multilayers was utilized as a wiring material or an electrode material of a semiconductor device (semiconductor element) of an insulating gate field-effect transistor and a semiconductor integrated circuit utilizing a number of them. By overlaying such wirings with insulating films between them, it was comparatively easy to form the wirings.

In the conventional method, it was a problem that short circuit between an upper wiring and a lower wiring happened many times because insulation between wirings was made by an insulating film of 1 μm thickness at most (In many cases, it was a single-layer.). This short circuit was mainly caused by bubbles, holes (pin holes), dusts and the like made in the insulating film. Conventionally, in a semiconductor integrated circuit formed especially on a silicon single-crystal substrate, an insulating film was formed of a material like phosphosilicate glass, and was half melted at a high-temperature of approximately 1000° C. Thus insulating property between wirings was improved by making the bubbles or pin holes disappeared. This process can also make smoother the unevenness generated on the substrate by each process of forming a thin film. It was prominently effective especially to prevent disconnection of metal wires formed on the insulating film.

However, this method is not applicable to every kind of semiconductor devices and integrated circuits. It is quite natural that this method is not applicable to semiconductor devices and integrated circuits utilizing a material which is not proof against such a high temperature. For example, this method is not applicable to a cheap glass substrate of which distortion point is usually 750° C. or less. A material like aluminum to decrease resistance as a wiring could not be utilized, either.

Generally, a higher process temperature needed better heat resistance for the device in the process. This made equipment investment huge. The bigger an object like a substrate to be treated became, the more the amount of investment became exponentially. For example, when a thin film transistor (TFT) is produced to use it as a big liquid crystal display, the size of the substrate should be 300 mm×300 mm or bigger, and it was actually impossible to adopt a high temperature process as high as 1000° C.

The present invention was made to solve above problems, and is aimed at obtaining bigger effects by a totally creative method which has never been thought of before.

SUMMARY OF THE INVENTION

It is an object of the present invention to provide an insulated-gate FET free of the foregoing problems.

The above object is achieved by an insulated-gate FET in which the channel length, i.e., the distance between the source region and the drain region, is made larger than the length of the gate electrode taken in the longitudinal direction of the channel (the direction of the channel length), whereby offset regions are formed in those portions of the channel regions which are in contact with the source and drain regions, respectively. The offset regions undergo no or very weak electric field from the gate electrode. The current-voltage characteristic of this device is shown in FIG. 4.

It is another object of the invention to provide a method for forming the insulated-gate FET described in the preceding paragraph.

Other objects and features of the invention will appear in the course of the description which follows.

Referring to FIG. 1, the fundamental structure of a field-effect transistor according to the invention is shown. This transistor has an insulating substrate 105 and a blocking layer 104 formed on the substrate 105. A semiconductor layer which becomes a source region 100, a drain region 101, and a channel region 109 is formed on the blocking layer 104. A gate-insulating film 110 is formed on the channel region 109. A gate electrode 111 is formed on the gate-insulating film 110. An oxide layer 112 which is an insulating layer is formed on the gate electrode 111. The oxide layer 112 is formed by anodizing a material which can be anodized. A source electrode 102 and a drain electrode 103 are formed so as to be in contact with the source region and the drain region, respectively. No interlayer insulator is shown in FIG. 1, but where the parasitic capacitance between the gate electrode or the interconnects to this gate and the source, the drain, or the interconnects to the source or drain poses a problem, an interlayer insulator may be formed in the same way as in the prior art techniques. Examples of this will be described later.

Referring still to FIG. 1, the gate electrode portion which becomes the gate electrode 111 and the oxide layer 112 is made of a material that can be anodized. The surface portion of the gate electrode portion is anodized to form the oxide layer 112. The distance between the source region 100 and the drain region 101 which are to be implanted with ions, i.e., the channel length 108, is larger than the substantial length of the gate electrode 111 taken in the longitudinal direction of the channel by a length which is about twice as large as the thickness of the oxide layer 112. The gate electrode portion comprises metal or semiconductor. Chiefly, the material of the gate electrode portion is one selected from titanium (Ti), aluminum (Al), tantalum (Ta), chromium (Cr), and silicon (Si). Alternatively, the gate electrode portion is made of an alloy of some of these materials.

As a result, those portions 106 and 107 of the channel region 109 which are on the opposite sides of the gate-insulating film 110 from the portions of the oxide layer 112 formed on both sides of the gate electrode receive no electric field from the gate electrode or experience much weaker field than the portions immediately under the gate electrode. These regions 106 and 107 are hereinafter, especially where they are comparable to the channel region in crystallinity and dose, referred to as the offset regions.

These regions 106 and 107 can be made of doped amorphous materials. More strictly, it is only necessary that the regions 106 and 107 be inferior in crystallinity to the adjacent source region 100 and drain region 101. For example, if the source region 100 and the drain region 101 consist of polysilicon having large crystal grains, then it is only necessary that the regions 106 and 107 be made of amorphous silicon or semi-amorphous silicon that is slightly superior in crystallinity to amorphous silicon. If the regions 100 and 101 are made of semi-amorphous silicon, the regions 106 and 107 can be made of amorphous silicon. Of course, these amorphous materials are required to be sufficiently treated so that they behave as semiconductors. As an example, in order to minimize dangling bonds, it is necessary that these bonds be sufficiently terminated by hydrogen or a halogen element.

A good TFT (thin-film transistor) characteristic as shown in FIG. 9($a$) could be obtained by forming these amorphous regions. FIG. 9($b$) shows the current-voltage characteristic of a thin-film transistor of the prior art insulated-gate transistor structure. As can be seen by comparing these characteristic curves, very large leakage current was observed in the reverse direction when the prior art method was used. In accordance with the present invention, substantially amorphous regions are formed, thus improving the characteristic. That is, formation of doped amorphous regions yields the same advantages as the formation of the previously described offset regions.

Why the formation of the amorphous regions improves the characteristic is not fully understood. One possible cause is as follows. In the amorphous regions, the added dopant element is ionized at a lower rate than in the crystal regions. Therefore, if dopants are added at the same dose, the amorphous regions behave as though they had lower dopant concentrations. That is, regions substantially similar to lightly doped drains are formed. For instance, the ionization rate of silicon in amorphous state is 0.1–10% at room temperature, which is much lower than the ionization rate of almost 100% of single-crystal or polycrystal semiconductors.

Another possible cause is that the bandgap in amorphous state is larger than the bandgap in crystalline state. For example, this can be explained away by the energy band diagrams of FIGS. 9, ($e$) and ($f$). In transistors of normal, lightly doped drain structure, the energy bands between the source, channel, and drain are shown in FIGS. 9, ($c$) and ($d$). The central raised portion indicates the channel region. The staircase portions indicate lightly doped drain regions. FIG. 9($c$) indicates the case in which no voltage is applied to the gate electrode. When a large negative voltage is applied to the gate electrode, the condition shown in FIG. 9($d$) appears. At this time, forbidden bands exist between the source and the channel region and between the channel region and the drain to thereby inhibit movement of carries such as electrons and holes. However, the carriers pass across the gap by the tunnel effect or by hopping the trap level within the bandgap. In normal thin-film transistors (TFTs) which are not of the lightly doped drain structure, the gap width is smaller and so electric current flows more easily. This is considered to be the leakage in the reverse direction. This phenomenon is especially conspicuous for TFTs and possibly caused by numerous trap levels due to grain boundaries because TFTs are made of inhomogeneous materials such as polycrystals.

Where the bandgap in the lightly doped drain region is increased, the above-described leakage in the reverse direction decreases. This example is shown in FIGS. 9, (e) and (f). FIG. 9(e) shows the condition in which no voltage is applied to the gate. FIG. 9(f) shows the condition in which a large negative voltage is applied to the gate. When a negative voltage is applied as shown in FIG. 9(f), the width of the gap between the source and channel region and the width of the gap between the channel region and the drain are larger than those in case of FIG. 9(d), as can be seen by comparing FIG. 9(f) with FIG. 9(d). The tunnel effect is affected greatly by the width of the tunnel carrier (in this case the width of the gap). The probability that carriers tunnel through the gap is reduced greatly with increasing the width of the gap slightly. Also, hopping via local energy levels is a composite tunnel effect and, therefore, if the width of the gap increases, the probability drops drastically. For these reasons, formation of lightly doped drain regions having large bandgaps is considered as advantageous. The bandgaps of amorphous silicon is 1.5 to 1.8 eV, while the bandgap of polycrystalline silicon is 1.1 eV. If materials having such wide bandgaps are used in lightly doped drains, a quite ideal situation occurs.

To fabricate a semiconductor device in accordance with the present invention, especially a semiconductor device having the aforementioned offset regions, the gate electrode portion is formed out of a material capable of being anodized after the semiconductor layer becoming the source, drain, and the channel region and the gate-insulating layer 110 are formed. Subsequently, dopant ions which impart p- or n-type to the semiconductor layer are implanted into this semiconductor layer to form the source region 100 and the drain region 101. Thereafter, the surface of the gate electrode portion is anodized (anodic oxidized) to form the gate electrode 111 and the oxide layer 112. Thereafter, a thermal treatment or other step is carried out.

Alternatively, after forming the semiconductor layer and the gate-insulating layer 110, the gate electrode portion is fabricated out of a material that can be anodized, followed by anodization (anodic oxidation) of the surface of the gate electrode portion to form the gate electrode 111 and the oxide layer 112. Then, dopant ions are implanted into the semiconductor layer to impart p- or n-type to it, forming the source region 100 and the drain region 101. Thereafter, a thermal treatment is effected.

By carrying out these steps, insulated-gate FETs in which the channel length is greater than the length of the gate electrode taken in the longitudinal direction of the channel can be easily and certainly fabricated without producing variations in the performance which would otherwise be caused by mask misalignment.

Another method of fabricating the novel semiconductor device having amorphous regions is initiated by forming the semiconductor layer becoming the source, drain, and channel region and the gate-insulating layer 110. Then, the gate electrode portion is fabricated from a material that can be anodized. Subsequently, dopant ions are implanted so that the semiconductor layer is doped p- or n-type. As a result, the semiconductor layer is made amorphous. The source region 100, the drain region 101, and their adjacent amorphous regions 106 and 107 are formed. Thereafter, the surface portion of the gate electrode portion is anodized to form the gate electrode 111 and the oxide layer 112. At this time, the surface of the gate electrode is made to retreat by the oxidation. Then, only the source region 100 and the drain region 101 may be recrystallized while using the gate electrode portion as a mask by a self-aligning process employing laser annealing or flash lamp annealing techniques. This process is of the self-aligning type, because the gate electrode portion shades the underlying doped regions located under the gate electrode portion, thus inhibiting recrystallization of these doped regions.

Where an ion implantation process is utilized, the spreading of the doped regions due to secondary diffusion of ions can be calculated from the acceleration energy of the ions. Also, the retreat of the gate electrode is determined by the thickness of the oxide layer and so the retreat is also taken as a design parameter. In accordance with the present invention, the positional relation between the gate electrode and the doped regions can be optimized by accurate design. In particular, the thickness of the oxide layer can be controlled to tolerances less than 10 nm. Also, the secondary scattering produced during ion implantation can be controlled to tolerances of the same order. Consequently, the positional relation can be controlled to tolerances less than 10 nm during the fabrication.

In this way, the invention requires no further accurate mask alignment. The possibility that the production yield is deteriorated by the invention is low. Rather, the inventive device has greatly improved characteristics.

The present invention is aimed at providing an insulating film formed around at least one wiring and formed of the material for the wiring. It is desirable to form such an insulating film by oxidizing the material so as not to make bubbles or pin holes. Anodic oxidation, plasma oxidation method, or thermal oxidation method is desirable as a method of oxidation. As an appropriate material of the wiring, simple substances, semiconductors, or alloys of silicon, aluminum, tantalum, titanium, tungsten, or molybdenum, and what is more, a metal compound in a condition of not being oxidized, such as tantalum nitride, titanium nitride, tungsten silicide, and molybdenum silicide is appropriate. For example, a nitride like tantalum nitride changes to be tantalum oxide by anodic oxidation.

A semiconductor device in accordance with the present invention comprises:

a substrate;

a gate electrode of a transistor provided on said substrate;

a first wiring provided on said substrate in the same layer as said gate electrode; and a second wiring provided in a layer different from said same layer, wherein said first wiring and said second wiring cross each other, and said first wiring is provided with an oxide of a material of said first wiring on an upper or side surface of said first wiring, and said gate electrode is provided with an oxide of a material of said gate electrode on an upper or side surface of said gate electrode at a thickness different from that of said oxide of the material of said first wiring at the crossing.

The semiconductor device further comprises source and drain regions on the substrate, a channel region provided on the substrate between the source and drain regions, and a gate insulating layer provided between the channel region and the gate electrode.

The first wiring comprises, for example, silicon, aluminum, tantalum, titanium, tungsten, molybdenum, an alloy thereof, tantalum nitride, titanium nitride, tungsten silicide, or molybdenum silicide.

It is natural capability of insulation is improved if an additional insulating film is formed by a method such as chemical vapor deposition (CVD), because above mentioned oxide has a good insulation. However, characteristic of the present invention is not to make the oxide insulating film in a homogeneous thickness around the material of the wiring over the whole surface, but to determine thicknesses of the oxide insulating film according to location thereof to accomplish the purpose.

The present invention is firstly related to an MIS (metal-insulator-semiconductor structure) transistor, and a manufacturing technology thereof with such wiring oxide as a mask. In the case of forming an impurity region (source, drain) of an MIS transistor by well known self-align method, a slight overlap was sometimes made between the gate electrode and the source region, drain region, because impurities were introduced with a gate electrode as a mask. In this case, an electric field was concentrated to a portion where the drain and the gate electrode were close to each other. That sometimes broke the gate insulating film near it.

This inventor found that by separating the gate electrode from at least one of the source and drain regions to provide an offset region between the gate electrode and at least one of the source and drain regions, such concentration of electric field could be prevented and the gate insulating film could be prevented from being broken. For example, the gate electrode is 500 to 5000 Å distant from at least one of the source and drain regions. Indeed, it was difficult to obtain such a minute offset region with good reproducibility by using a conventional method. In addition to the gate electrode, this inventor decided to use an oxide around the gate electrode as a mask when an impurity was introduced. Moreover, this inventor found that above mentioned purpose can be achieved by strictly controlling the thickness of this oxide to be the size of offset.

The inventor also found that characteristic of the MIS transistor changes according to the size of the offset made here. In general, if offset was big, dielectric strength of a transistor obtained was high, and leak current between the source and drain was small, but mobility was low. On the contrary, if offset was small, mobility was high, but dielectric strength was low.

For example, both a transistor with high dielectric strength and a transistor which can be driven fast were sometimes needed in the same substrate, but they were not made separately in such case. The present invention is firstly characterized in that such transistors with different characteristics are controlled by the size of offset (that is, thickness of oxide of wiring-gate electrode), and transistors appropriate for different purposes are formed in the same substrate.

For example, in a liquid crystal display of TFT active matrix type, a transistor with big offset is formed as TFTs for active matrix, and on the other hand, a transistor with small offset is formed as TFTs for peripheral circuits which must be driven fast, both of the transistors being formed on the same substrate. In addition, a structure comprising a logic circuit made of a transistor with small offset and an output transistor made of a transistor with big offset can be utilized for a peripheral circuit.

The present invention is secondly related to an MIS type transistor and a wiring connected to it. In a wiring in the same layer of the gate electrode of the MIS type transistor, oxide is made thick in the portion where this wiring is crossed with an upper wiring. On the other hand, an oxide film of the wiring of the gate electrode is thinned or is not formed at all. In this case, the transistor can be driven at a high speed because of small offset. On the other hand, at the portion where the wirings are crossed, an effect of good insulating property is obtained because of the thick oxide.

The present invention is thirdly related to a capacitor provided in a semiconductor circuit and to an integrated circuit with such a capacitor. They have a part of wirings as an electrode of a capacitor of which peripheral portion is covered with its oxide. On the other hand, in other portions of the wirings, peripheral portions of wirings are covered with an oxide at places where the wirings are crossed with upper wirings, too. By thinning oxide comprising a capacitor electrode, capacitance of the capacitor is made big. By thickening oxide at a place where wirings are crossed, and, by depositing additional oxide film on the place, insulating property between the wirings is improved and capacity coupling between them is decreased.

A semiconductor device in accordance with the present invention comprises:

a substrate;

a capacitor provided on said substrate;

a first wiring provided on said substrate in the same layer as a first electrode of said capacitor; and a second wiring provided on said substrate in the same layer as a second electrode of said capacitor, wherein said first wiring and said second wiring cross each other at a location B other than that of said capacitor, and said first wiring is provided with an oxide of a material of said first wiring on an upper or side surface of said first wiring, and said first electrode is provided with an oxide of a material of said first electrode on an upper surface of said first electrode at a thickness different from that of said oxide of the material of said first wiring at the location B.

The first wiring comprises, for example, silicon, aluminum, tantalum, titanium, tungsten, molybdenum, an alloy thereof, tantalum nitride, titanium nitride, tungsten silicide, or molybdenum silicide. The oxide of the material of the first wiring is thicker than the oxide of the material of the first electrode.

The present invention is fourthly related to a method of oxidizing wirings in forming such oxide. There are three methods. The first method is briefly shown in FIG. 19. As is shown in FIG. 19(A), a wiring 52 is formed directly or, if necessary, after deposition of a surface oxide film 51, on a substrate 50. A mask material 53 is provided to a portion forming a contact with upper wirings. It is important that the mask material has a function of blocking oxidizing effect, and is selected according to methods of oxidation. For example, in a method of thermal oxidation at a high temperature of several hundred centigrade, heat resistance is needed to a mask material. In this case, a material like silicon nitride which can be easily deposited and has good heat resistance and good resistance to oxidation is appropriate. If the wiring is oxidized at a lower temperature than above, more materials are useful. For example, if the process is performed at 400° C. or less, an organic material such as polyimide can be utilized. Polyimide can be formed with a very low cost, because it does not need a vacuum apparatus for formation. Moreover, its mass productivity is good. Especially photosensitive polyimide (photoneece) is easy to use because patterning can be performed by a conventional photolithography method.

Oxidation of the wiring is performed in this condition with a first mask being provided selectively on the wiring, and a thin oxide film is formed around the wiring as is shown in FIG. 19(B). The wiring comprises, for example, silicon, aluminum, tantalum, titanium, tungsten, molybdenum, an alloy thereof, tantalum nitride, titanium nitride, tungsten silicide, or molybdenum silicide. A second mask 55 is formed on a region containing at least a portion of the first mask, and oxidation of the wiring is performed in the same way. Thus a thick oxide 56 is formed as is shown in FIG. 19(C). In this way, an oxide with different thicknesses is obtained, which is characteristic of the present invention.

By removing the first mask and the second mask, a contact hole 57 is formed as is shown in FIG. 19(D). What is noteworthy is that the thickness of the oxide changes in steps until it reaches the contact hole. As a result, difference of the level to the contact hole can be decreased. FIGS. 19(E) and (F) show the case when an upper wiring 59 is connected to the contact hole 57. The upper wiring is formed on at least a portion of a region from which the first mask is removed by the step shown in FIG. 19(D). If etching selection ratio between an interlayer insulator 58 and wiring oxide 54, 56 is enough and the area of the contact formation region is wide enough, more gradual steps are obtainable as is shown in FIG. 19(E). The interlayer insulator 58 is not necessarily needed. Because the thickness of the oxide under the upper wiring 59 becomes smaller in steps in the direction of the contact hole, disconnection of the upper wiring is difficult to happen. This method is effective in the case that etching cannot be performed substantially, because etching of an oxide of wirings is difficult, or because enough selection ratio with another material cannot be obtained.

The second method is shown in FIG. 20. As is shown in FIG. 20(A), a wiring 62 is formed directly, or if necessary, after deposition of a surface oxide film 61, on a substrate 60. The wiring comprises, for example, silicon, aluminum, tantalum, titanium, tungsten, molybdenum, an alloy thereof, tantalum nitride, titanium nitride, tungsten silicide, or molybdenum silicide. A thin oxide 63 is formed by oxidizing the surface of it. As is shown in FIG. 20(B), a mask material 64 is formed in a portion forming a contact hole. Oxidation of the wiring 62 oxidized at a surface of the wiring is performed in this condition with a mask being provided selectively on the wiring, and though the portion covered with the mask material remains a thin oxide 66, but a thick oxide film 65 is formed on other portions. In this way, an oxide with different thicknesses which is characteristic of the present invention is obtained. Then, the mask is removed.

As is shown in FIG. 20(D), the region 66 covered with a thin oxide is etched, and a contact hole 67 is formed in said surface after the removal of the mask in at least a portion of a region from which the mask is removed by the removing step of FIG. 20(C). In this case, too, the thickness of the oxide changes in steps until it reaches the contact hole. As a result, difference of level to the contact hole can be decreased. FIGS. 20(E) and (F) show the case when an upper wiring 69 is connected to the contact hole 67. The upper wiring 69 is formed at least in a portion of the contact hole. An interlayer insulator 68 is not necessarily needed.

The third method is shown in FIG. 21. As is shown in FIG. 21(A), a wiring 72 is formed directly, or if necessary, after deposition of a substrate oxide film 71, on a substrate 70. The wiring comprises, for example, silicon, aluminum, tantalum, titanium, tungsten, molybdenum, an alloy thereof, tantalum nitride, titanium nitride, tungsten silicide, or molybdenum silicide. A thick oxide 73 is formed by oxidizing the surface of it. As is shown in FIG. 21(B), a thick oxide is etched by photolithography method, and a thin oxide 75 is provided. In this way, an oxide with different thicknesses which is characteristic of the present invention is obtained.

A contact hole 76 is formed further to a portion in which a thin oxide is formed, e.g. by selectively etching the wiring 72 oxidized at a surface of the wiring 72. In this case, too, the thickness of an oxide changes in steps until it reaches the contact hole, and different level to the contact hole can be decreased. An interlayer insulator is formed on the substrate after the etching for the formation of the contact hole 76. A contact hole is formed in the interlayer insulator. FIG. 21(D) and (E) show the case when an upper wiring 78 is connected to the contact hole 76. The upper wiring 78 is formed over the contact hole. The interlayer insulator 77 is not necessarily needed. In this method, when the thick oxide 73 is etched to make it a thin oxide 75, if an etching rate is not uniform, its thickness will not be homogeneous. Therefore, to make this method real, an etching technology of an oxide is important. On the other hand, in the first and second methods, the thickness of an oxide is decided by selective oxidation of wirings. For example, the thickness of an oxide is decided by temperature and time in the case of thermal oxidation, and it is decided by voltage applied in the case of anodic oxidation. As long as these parameters are fixed, the thickness of the oxide is equal. Therefore, these methods are more secure method and have higher reliability compared with the third method.

BRIEF DESCRIPTION OF THE DRAWINGS

FIGS. 8, (A)–(F), are cross-sectional views of a portion of the novel active-matrix liquid-crystal electro-optical device shown in FIGS. 6 and 7, illustrating the sequence in which the device is fabricated;

FIGS. 9, (*a*) and (*b*), are graphs showing characteristics of thin-film transistors;

FIGS. 9, (*c*)–(*f*), are diagrams illustrating the principle of operation of thin-film transistors according to the invention;

FIGS. 10, (A)–(D), are cross-sectional views of a thin-film transistor according to Example 5 of the invention, illustrating the sequence in which the device is fabricated;

FIG. 14 is a circuit diagram of a portion of an active-matrix liquid-crystal electro-optical device according to Example 7;

DETAILED DESCRIPTION OF THE INVENTION

EXAMPLE 1

Figure 1:
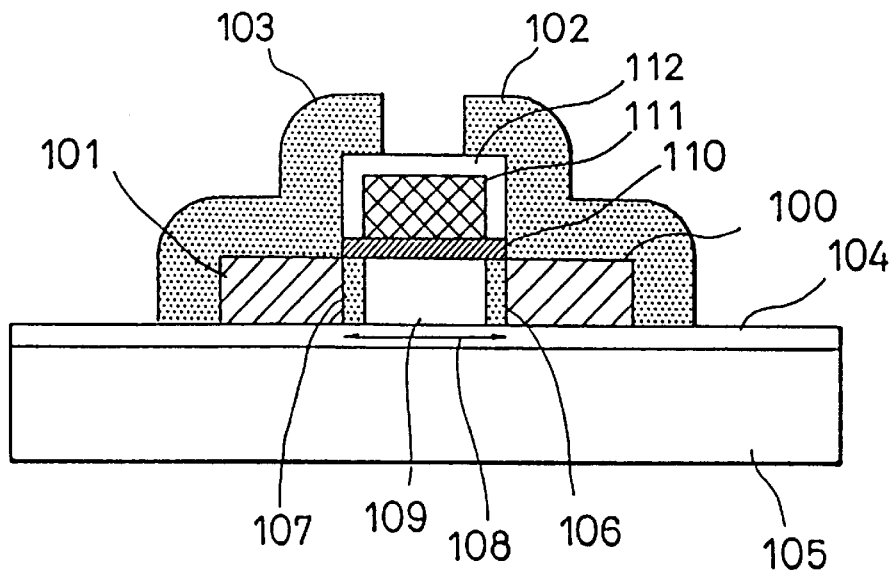
FIG. 1 is a cross-sectional view of a semiconductor device according to the invention.
Figure 2:
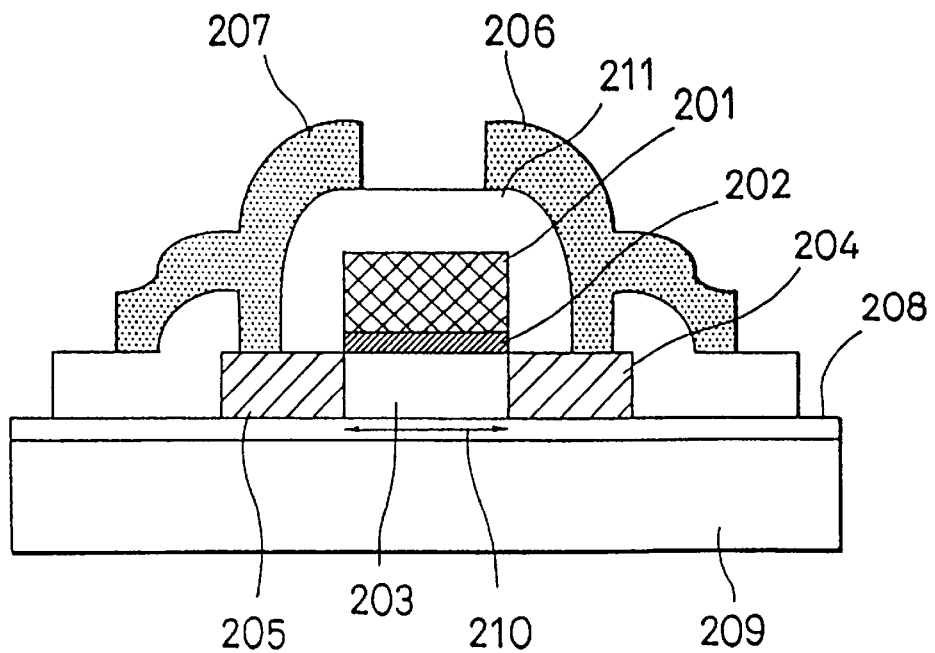
FIG. 2 is a cross-sectional view of a conventional semiconductor device.
Figure 3:
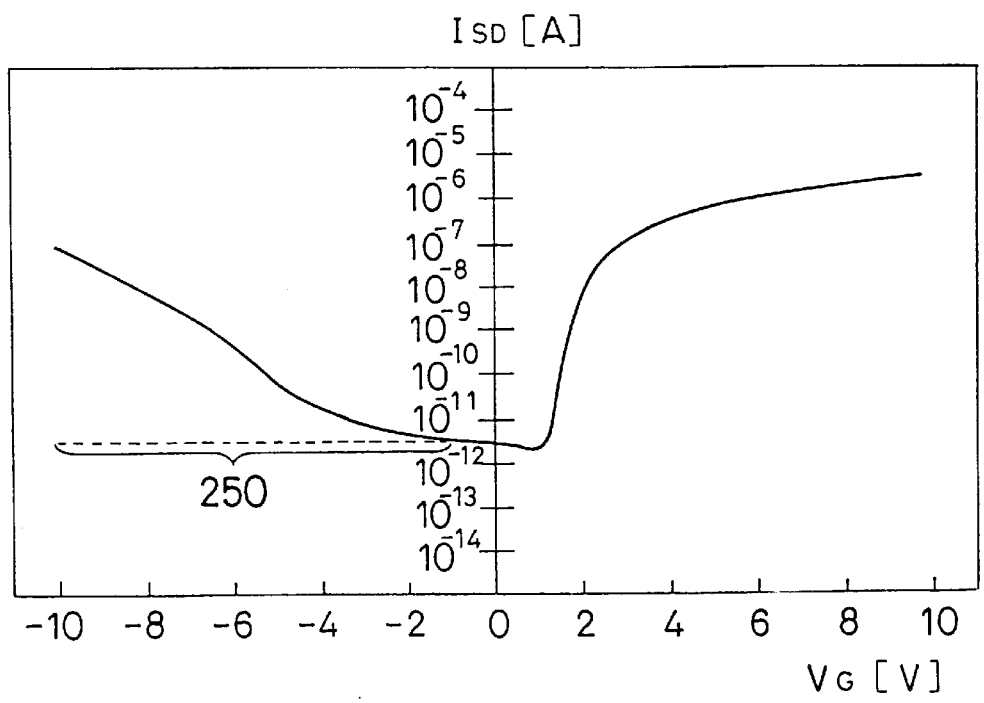
FIG. 3 is a graph showing the current-voltage characteristic of the conventional semiconductor device shown in FIG. 2.
Figure 4:
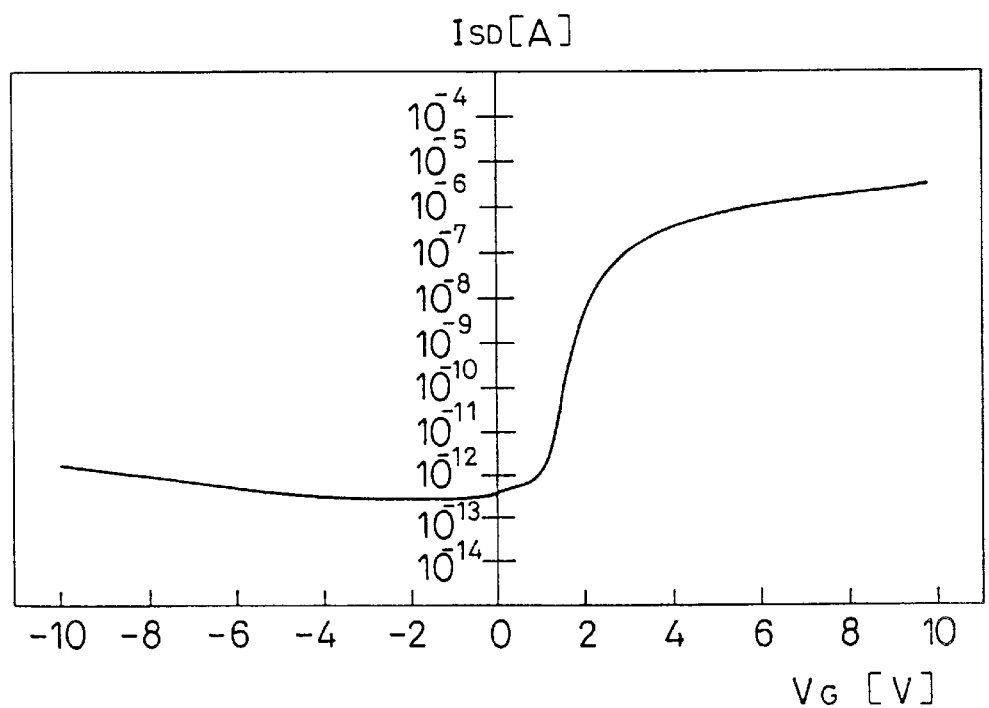
FIG. 4 is a graph showing the current-voltage characteristic of the novel semiconductor device shown in FIG. 1.
Figure 5A:
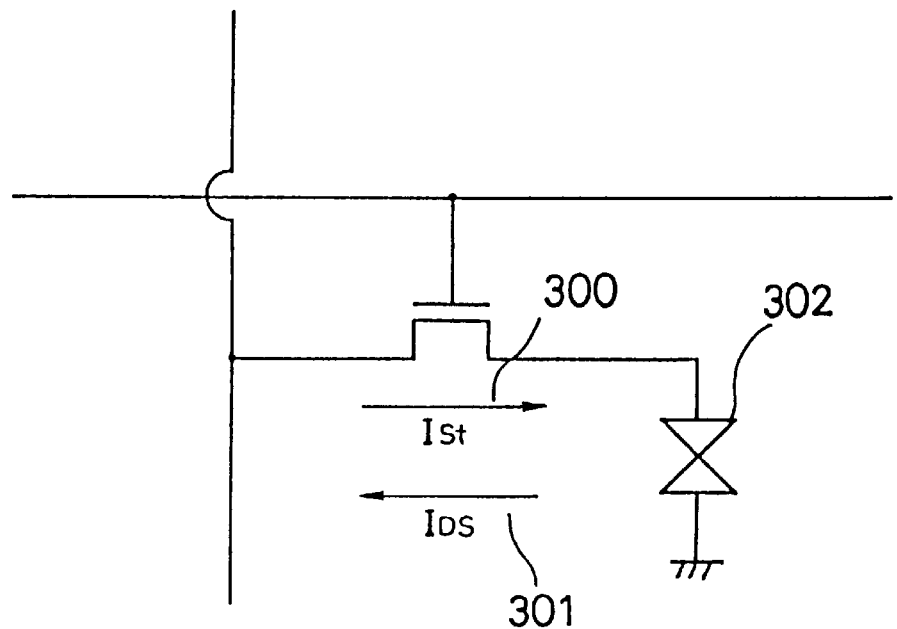
FIGS. 5, (A) and (B), are circuit diagrams of portions of conventional active-matrix liquid-crystal electro-optical devices.
Figure 5B:
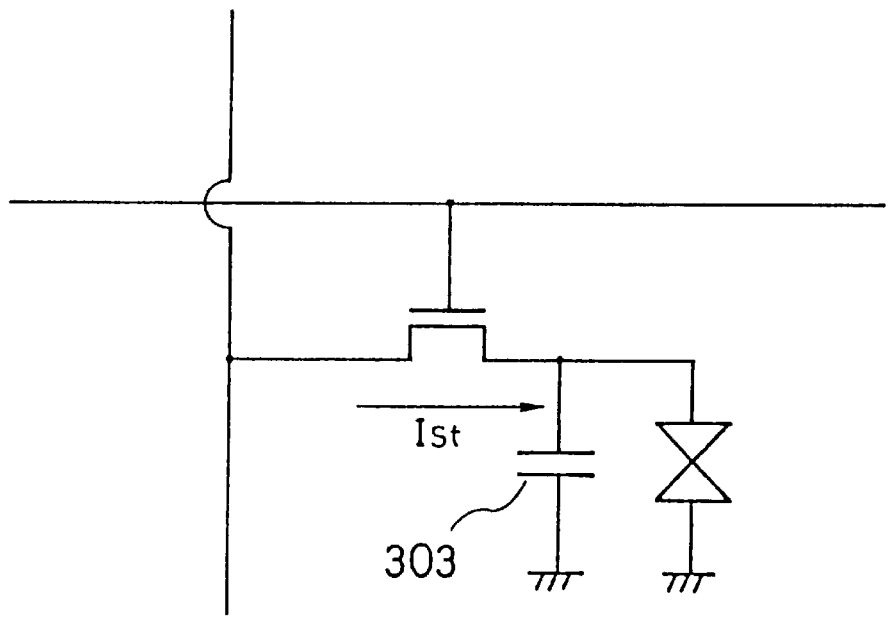
Figure 6:
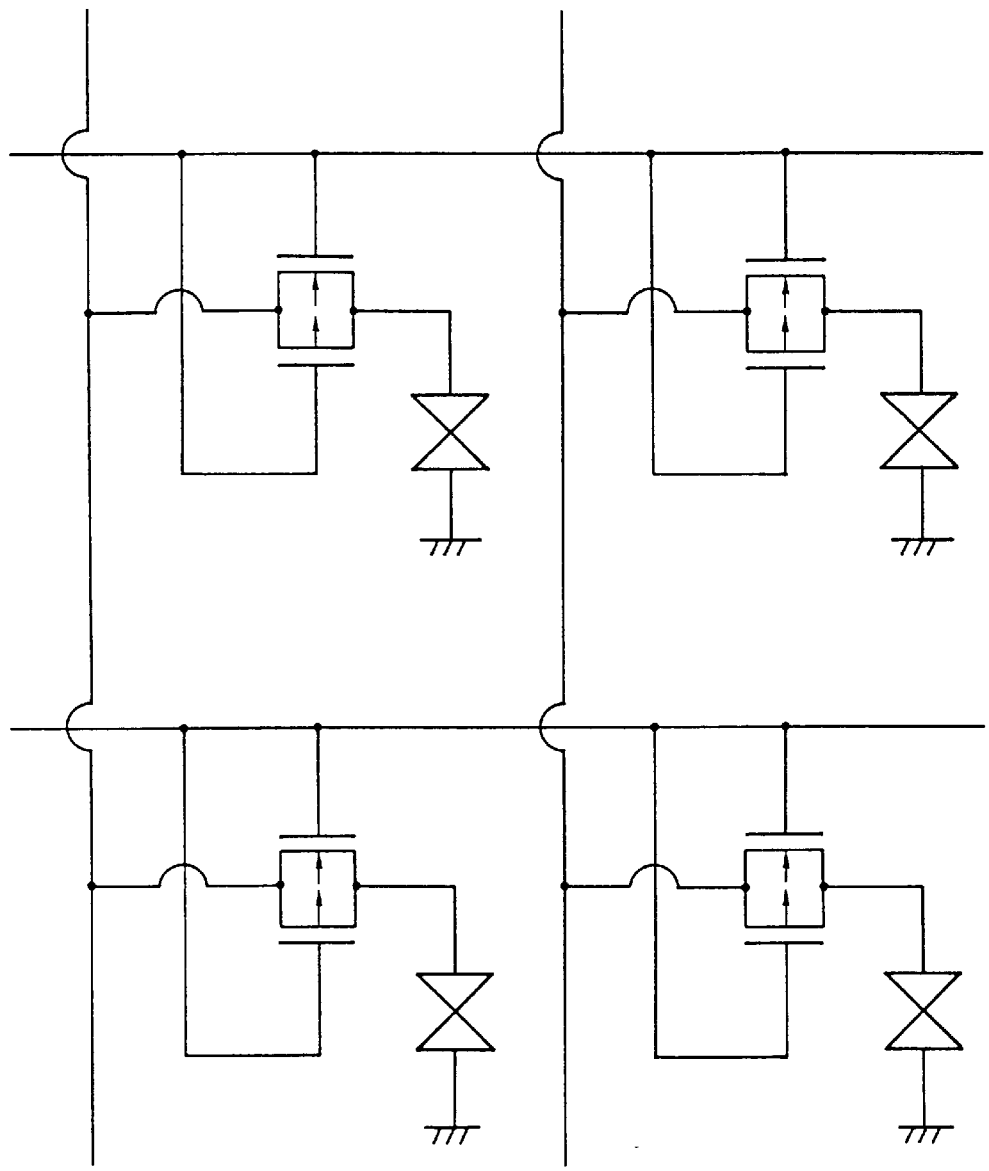
FIG. 6 is a circuit diagram of a portion of an active-matrix liquid-crystal electro-optical device according to the invention, the device forming Example 1 of the invention.
Figure 7:
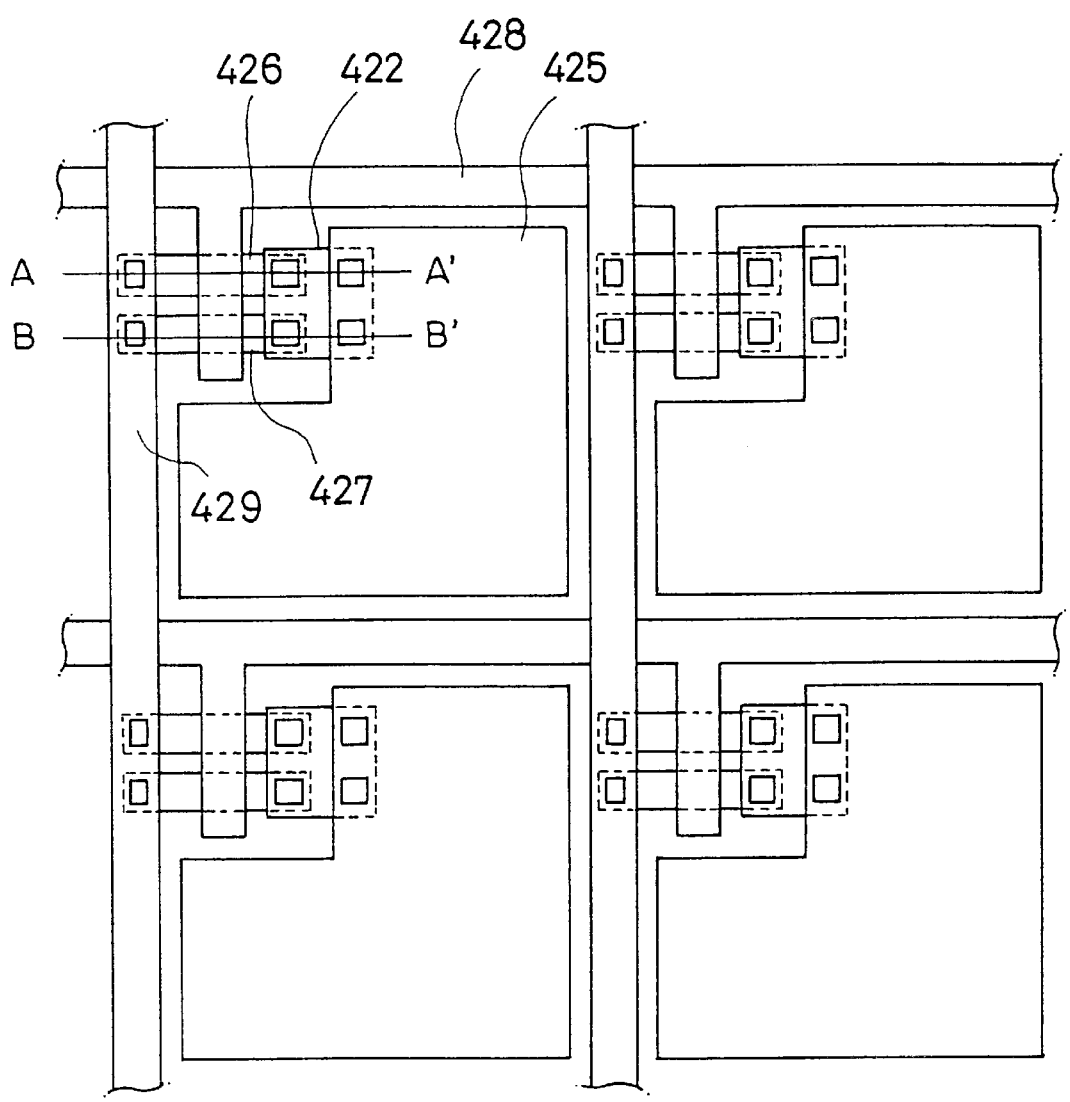
FIG. 7 is a plan view of the portion of the novel active-matrix liquid-crystal electro-optical device shown in FIG. 6.

A viewfinder for a video camera, using a liquid-crystal electro-optical device 1 inch in diagonal according to the invention was fabricated. The device had 387×128 pixels. The viewfinder was fabricated from high-mobility TFTs (thin-film transistors) in a low-temperature process. The arrangement of active elements on the substrate of a liquid-crystal electro-optical device used in the present example is shown in FIG. 7. FIG. 6 is a circuit diagram of the present example. The manufacturing steps are shown in FIGS. 8, (A)–(F), which are taken along lines A–A' and B–B'. The cross sections taken along the line A–A' show an n-channel TFT. The cross sections taken along the line B–B' show a p-channel TFT.

In FIG. 8(A), a glass substrate 400 was made of an inexpensive material and withstood a thermal treatment below 700° C., e.g., at about 600° C. Silicon oxide was sputtered on the glass substrate 400 to a thickness of 1000 to 3000 Å by a magnetron RF (high frequency) sputtering process to form a blocking layer 401. The ambient was 100% oxygen. The film was formed at 150° C. The output of the magnetron was 400 to 800 W. The pressure was 0.5 Pa. The used target was made of quartz or a single crystal or silicon. The deposition rate was 30 to 100 Å/min.

A film of silicon was formed on this blocking layer 401 by low-pressure CVD (LPCVD), sputtering, or plasma-assisted CVD. Where the film was being formed by low-pressure CVD, disilane ($Si_2H_6$) or trisilane ($Si_3H_8$) was supplied into the CVD equipment at a temperature (e.g., 450 to 550° C.) lower than the crystallization temperature by 100 to 200° C., e.g., at 530° C. The pressure inside the reaction furnace was 30 to 300 Pa. The deposition rate was 50 to 250 Å/min. To make the p-channel and n-channel TFTs have substantially uniform threshold voltage Vth, boron in the form of diborane may be added to the film at a concentration of $1\times10^{15}$ to $1\times10^{18}$ atoms/cm$^3$.

Where the sputtering process was used, the back pressure prior to the sputtering was $1\times10^{-5}$ Pa or less. A single crystal of silicon was used as a target. The process was carried out within an ambient of argon to which 20–80% hydrogen was added. For example, argon accounted for 20%, while hydrogen accounted for 80%. The film was formed at 150° C. The RF frequency was 13.56 MHz. The sputtering output was 400 to 800 W. The pressure was 0.5 Pa.

Where the silicon film was formed by plasma-assisted CVD, the temperature was 300° C., for example. Monosilane ($SiH_4$) or disilane ($Si_2H_6$) was used. This material was introduced into the PCVD equipment. The film was formed while applying RF electric power of 13.56 MHz.

Preferably, the oxygen content of the films formed by these methods are $5\times10^{21}$ atoms/cm$^3$ or less. If this oxygen concentration is high, it is difficult to crystallize the film. As a result, it is necessary to elevate the thermal annealing temperature or to lengthen the thermal annealing time. Conversely, if the oxygen concentration is too low, the leakage current in OFF state is increased due to backlight. Therefore, the appropriate concentration ranges from $4\times10^{19}$ to $4\times10^{21}$ atoms/cm$^3$. The hydrogen concentration was $4\times10^{20}$ atoms/cm$^3$, which was 1 atomic % of the silicon concentration of $4\times10^{22}$ atoms/cm$^3$.

After the amorphous silicon film was formed to a thickness of 500 to 5000 Å, e.g., 1500 Å, by any of the above-described methods, the laminate was thermally treated at a middle temperature of 450 to 700° C. for 12 to 70 hours within a nonoxidizing ambient. For example, the laminate was placed within an ambient of hydrogen at 600° C. Since the amorphous silicon oxide film was formed at the surface of the substrate under the silicon film, no specific nuclei existed during this thermal treatment. Hence, the whole laminate was annealed uniformly. That is, during the formation of the film, it assumed an amorphous structure. Hydrogen was merely mixed into it.

The silicon film was shifted from the amorphous state to a more highly ordered state by the annealing. Portions of the silicon film assumed a crystalline state. Especially, those regions which assumed a comparatively ordered state during the formation of the silicon film tended to crystallize. However, intervening silicon atoms between these highly ordered regions couple together these regions and, therefore, the silicon atoms attract each other. Measurement by laser Raman spectroscopy has shown that peaks shifted toward lower frequencies from the peak 522 cm$^{-1}$ of a single crystal of silicon existed. Calculation from the half-width values has revealed that the apparent particle diameters ranged from 50 to 500 Å. That is, they resembled microcrystallites. In practice, however, there existed numerous crystalline regions, i.e., clusters were produced. These clusters were anchored to each other by the silicon atoms. The resulting coating had a semi-amorphous structure.

As a result, it might be said that substantially no grain boundaries existed in this coating. Since carriers can move easily from cluster to cluster through the anchored locations, the carrier mobility is higher than polycrystalline silicon having clear grain boundaries. More specifically, the Hall mobility ($\mu h$) is 10 to 200 cm$^2$/V·sec. The electron mobility ($\mu e$) is 15 to 300 cm$^2$/V·sec.

If the coating is made polycrystalline by an anneal at a high temperature between 900° C. and 1200° C. rather than by an anneal at a moderate temperature as described above, then the impurities in the coating segregate because of solid-phase growth from nuclei. A large amount of impurities such as oxygen, carbon, and nitrogen is contained in the grain boundaries. The mobility within one crystal is large. However, movement of the carriers is impeded by the barriers formed at the grain boundaries. The result is that it is difficult to obtain a mobility exceeding 10 cm$^2$/V·sec. Therefore, it was necessary that the concentration of oxygen, carbon, nitrogen, and other impurities be a small or very small fraction of the impurity concentration in a semi-amorphous film. In this case, a mobility of 50 to 100 cm$^2$/V·sec was obtained.

The silicon film formed in this way was photolithographically etched to form a semiconductor layer 403 for n-channel TFTs and a semiconductor layer 404 for p-channel TFTs. The channel width of the layer 403 was 20 μm. A silicon oxide film 403 which would become a gate-insulating film was formed to a thickness of 500 to 2000 Å, e.g., 1000 Å, under the same conditions as the silicon oxide film forming the blocking layer. A small amount of fluorine could be added during the formation of the silicon oxide film to fix sodium ions.

Then, an aluminum film was formed on the silicon oxide film. The aluminum film was patterned, using a photomask. The result is shown in FIG. 8(B). A gate-insulating film 405 and a gate electrode portion 406 for an n-channel TFT were formed. The length of these film 405 and electrode portion 406, taken in the longitudinal direction of the channel, was 10 μm. That is, the channel length was 10 μm. Similarly, a gate-insulating film 407 and a gate electrode portion 408 for a p-channel TFT were formed. The length of these film 409 and electrode portion 408, taken in the longitudinal direction of the channel was, 7 μm. That is, the channel length was 7 μm. The thickness of the gate electrode portions 406 and 408 was 0.8 μm. In FIGS. 8(C), boron (B) was implanted into the source 409 and the drain 410 for the p-channel TFT at a dose of 1 to $5 \times 10^{15}$ ions/cm$^2$. Then, as shown in FIG. 8(D), a photoresist 411 was formed, using a photomask. Phosphorus (P) was implanted into the source 412 and the drain 413 for the n-channel TFT at a dose of 1 to $5 \times 10^{15}$ ions/cm$^2$.

Subsequently, the gate electrode portions were anodized. L-tartaric acid was diluted with ethylene glycol to a concentration of 5%, and the pH was adjusted to 7.0±0.2, using ammonia. The laminate was dipped in the solution and connected with the positive terminal of a constant current source. An electrode of platinum was connected to the negative terminal. An increasing voltage was applied while the current was maintained at 20 mA. The oxidation process was continued until the voltage reached 150 V. Then, the oxidation process was continued while the voltage was kept at 150 V until the current was reduced below 0.1 mA. In this way, an aluminum oxide layer 414 was formed on the surfaces of the gate electrode portions 406 and 408, thus giving rise to gate electrodes 415 and 416 for an n-channel TFT and a p-channel TFT, respectively. The thickness of the aluminum oxide layer 414 was 0.3 μm.

Then, the laminate was again annealed at 600° C. for 10 to 50 hours. The dopants in the source 412 and drain 413 of the n-channel TFT and in the source 409 and drain 410 of the p-channel TFT were activated so that these two kinds of regions doped n$^+$-type and p$^{30}$ type, respectively. Channel formation regions 417 and 418 were formed as semi-amorphous semiconductors under the gate-insulating films 405 and 407, respectively.

In the present method, the ion implantation of dopants and the anodization around the gate electrodes may be carried out in reverse order.

In this way, the insulating layer made of a metal oxide was formed around the gate electrodes. As a result, the substantial length of each gate electrode was shorter than the channel length by twice the thickness of the insulating film, in this case 0.6 μm. The formation of the offset regions to which no electric field was applied could reduce the leakage current in reverse bias.

In the present example, two anneals were conducted as shown in FIGS. 8; (A) and (E). Depending on the required characteristics, the anneal shown in FIG. 8(A) can be omitted. Both anneals may be carried out in one step illustrated in FIG. 8(E), thus shortening the manufacturing time. In FIG. 8(E), an interlayer insulator 419 was formed by sputtering silicon oxide. This formation of the silicon oxide film can use LPCVD, photo-assisted CVD, or atmosphere-pressure CVD. The interlayer insulator was formed to a thickness of 0.2 to 0.6 μm, e.g., 0.3 μm. Subsequently, openings 420 for electrodes were formed, using a photomask. As shown in FIG. 8(F), aluminum was sputtered onto the whole laminate. Leads 421, 423, and contacts 422 were formed, using a photomask. Thereafter, planarizing organic resin 424, e.g., polyimide resin that transmits light, was applied to the laminate. Again, holes for the electrodes were formed, using the photomask.

In order to use the two TFTs as a complementary pair and to connect this pair to one pixel electrode of a liquid-crystal device, an indium tin oxide (ITO) film was formed by sputtering, said one pixel electrode being a transparent electrode. This film was etched, using a photomask, to form electrodes 425. The ITO film was formed at a temperature between room temperature and 150° C. and annealed at 200–400° C. in an ambient of oxygen or atmosphere. In this way, an n-channel TFT 426, a p-channel TFT 427, and the electrodes 425 of a transparent conductive film were formed on the same glass substrate 401. The obtained TFTs exhibited the following electrical characteristics. The mobility of the p-channel TFT was 20 cm$^2$/V·sec, and the threshold voltage Vth was −5.9 V. The mobility of the n-channel TFT was 40 cm$^2$/V·sec, and the threshold voltage Vth was 5.0 V.

One substrate of a liquid-crystal electro-optical device was fabricated by the method described above. The arrangement of the electrodes and other components of this liquid-crystal electro-optical device is shown in FIG. 7. The n-channel TFT 426 and the p-channel TFT 427 were formed at the intersection of a first signal line 428 and a second signal line 429. Complementary pairs of TFTs of such a construction were arranged in rows and columns. The n-channel TFT 426 was connected to the second signal line 429 via the lead 421 at the input terminal of the drain 413. The gate electrode portion 406 was connected with the first signal line 428 which forms multilayered wiring. The output terminal of the source 412 is connected to the pixel electrodes 425 via contacts 422.

On the other hand, with respect to the p-channel TFT 427, the input terminal of the drain 410 was connected with the second signal line 429 via the lead 423. The gate electrode portion 408 was connected with the signal line 428. The output terminal of the source 409 is connected with the pixel electrodes 425 via the contacts 422, in the same way as the n-channel TFT. This structure is repeated horizontally and vertically to complete the present example.

As a second substrate, silicon oxide was sputtered on a soda-lime glass to a thickness of 2000 Å. Again, an ITO film was formed on this substrate by sputtering at a temperature between room temperature and 150° C. The film was annealed at 200–400° C. in an ambient of oxygen or atmosphere. A color filter was formed on this substrate, thus completing the second substrate.

A mixture containing 6 parts of acrylic resin that hardens on illumination of ultraviolet radiation and 4 parts of a nematic liquid crystal was sandwiched between the first and second substrates. The periphery of the substrates was fixed with epoxy resin. Since the leads on the substrates were spaced only 46 μm from each other, they were connected by the COG method. In the present example, gold bumps formed on an IC chip were connected by means of epoxy silver-palladium resin. The spaces between the IC chip and the substrates were buried with epoxy-modified acrylic resin, whereby all of them were bonded together hermetically. Then, polarizing plates were stuck to the outside. As a result, a transmission-type liquid-crystal electro-optical device was obtained.

EXAMPLE 2

FIGS. 10, (A)–(D), show cross-sections of the present example. A substrate 501 was fabricated from Corning 7059 glass. Then, an underlying silicon oxide film 502 was formed to a thickness of 100 nm by sputtering. Also, an amorphous silicon film 503 was formed to a thickness of 50 nm by plasma-assisted CVD. To protect the amorphous silicon film, a silicon oxide film 504 was formed to a thickness of 20 nm also by sputtering. The laminate was annealed at 600° C. for 72 hours within an ambient of nitrogen to recrystallize the films. The recrystallized films were patterned by a photolithographic method and reactive ion etching (RIE) to form semiconductor island regions as shown in FIG. 10(A). Then, the protective silicon oxide film 504 was removed by wet etching, using buffered hydrofluoric acid that was a solution of a mixture of hydrogen fluoride and ammonium fluoride. An example of this solution consisted of 1 part by weight of high-purity hydrofluoric acid (50% by weight) used for semiconductor fabrication and 10 parts by weight of a solution of ammonium fluoride (40% by weight) used for semiconductor fabrication. This buffered hydrofluoric acid etched silicon oxide at a rate of 70 nm/min, etched silicon at a rate of 60 nm/min, and etched aluminum at a rate of 15 nm/min.

A gate oxide film 505 having a thickness of 115 nm was formed by sputtering in an ambient of oxygen while using silicon oxide as a target. Under this condition, phosphorus ions were implanted into the gate oxide film 505 by a plasma doping method to getter the movable ions, such as sodium, existing inside the gate oxide film. Where the concentration of sodium is so low that the operation of the device is not impeded by the movable ions, it is not necessary to conduct the ion implantation. In the present example, the plasma-accelerating voltage was 10 keV. The dose was $2 \times 10^{14}$ ions/cm$^2$. The laminate was annealed at 600° C. for 24 hours. As a result, the damage to the oxide film and to the silicon film by the bombardment of the plasma doping was recovered.

Then, an aluminum film was formed by sputtering and patterned with a mixed acid, i.e., a solution of phosphoric acid to which 5% nitric acid was added, to form gate electrodes and their interconnects 506. The etching rate was 225 nm/min. when the etching temperature was 40° C. In this way, the contours of the TFTs were adjusted. At this time, the length of the channel was 8 μm, and the width was 20 μm.

N-type doped regions 507, or source and drain, were formed in the semiconductor region by ion implantation. In this step, phosphorus ions were implanted as dopant ions. The energy of the ions was 80 keV, and the dose was $5 \times 10^{15}$ ions/cm$^2$. As shown, the dopant ions were implanted through the oxide film. The advantage of the use of this implantation is that during subsequent recrystallization utilizing laser annealing, the smoothness of the surfaces of the doped regions is maintained. Where this implantation is not employed, numerous crystal nuclei form on the surfaces of the doped regions during recrystallization, thus giving rise to unevenness on the surfaces. In this way, the structure shown in FIG. 10(B) was derived. Of course, the crystallinity of doped portions is severely deteriorated by this ion implantation. These portions are substantially in amorphous state or in polycrystalline state close to the amorphous state.

An electrical current was passed through the interconnects 506. A film 508 of aluminum oxide was formed on the top surfaces and on the side surfaces of the gate electrodes and their interconnects by anodization. For this anodization, ethylene glycol solution of 3% tartaric acid was neutralized with 5% ammonia to control the pH of the solution of 7.0±0.2. Platinum was immersed as a cathode in the solution. Then, the TFTs were immersed in the solution together with the substrate. The interconnects 506 were connected with the anode of the power supply. The temperature was kept at 25±2° C.

Under this condition, an electrical current of 0.5 mA/cm$^2$ was first passed. When the voltage reached 200 V, the device was energized while maintaining the voltage constant. When the current reached 0.005 mA/cm$^2$, the current was cut off, thus bringing the anodization to an end. The thickness of the anodized film (anodic oxidation coating of the gate electrode) obtained in this way was about 250 nm. This is illustrated in FIG. 10(C).

Subsequently, the laminate was laser annealed, using a KrF excimer laser. For instance, 10 shots of laser pulses having a power density of 350 mJ/cm$^2$ were illuminated. We have confirmed that the crystallinity of the amorphous silicon can be recovered to such an extent that the amorphous silicon can withstand the operation of the TFTs by at least one shot of laser radiation. To sufficiently reduce the possibility of occurrence of defects due to fluctuations of the power of the laser, a sufficient number of shots of laser pulses are desired. However, too many shots of laser radiation will deteriorate the productivity. We have found that 10 shots or so which are used in the present example are most desirable.

The laser anneal was conducted within the atmosphere to increase the productivity. No problems took place, since the silicon oxide film had been already formed on the doped regions. Where the laser anneal was carried out while exposing the doped regions, oxygen entered the doped regions from the atmosphere simultaneously with the crystallization, thus deteriorating the crystallinity. Hence, TFTs having satisfactory characteristics could not be obtained. Therefore, laminates in which doped regions were exposed were required to be laser annealed in vacuum.

In the present example, as shown in FIG. 10(D), a laser radiation was made to obliquely enter the laminate. As an example, the laser radiation was at an angle of 10° to the normal to the substrate. The angle is determined according to the design specifications of the manufactured devices. Of the doped regions, the regions crystallized by the laser can be made asymmetrical. That is, regions 509 and 510 are doped regions which are sufficiently crystallized. A region 511 is not a doped region but crytallized by the laser radiation. A region 512 is a doped region but is not crystallized. For example, the doped region on the right side of FIG. 10(D) may be used as the drain in which hot electrons tend to occur.

In this way, the shapes of the devices were adjusted. Then, silicon oxide was sputtered to form an interlayer insulator in the conventional manner. Holes for electrodes were formed by a well-known photolithographical technique to expose the surface of the semiconductor region or the surfaces of the gate electrodes and their interconnects. Finally, a metal coating was selectively formed. In this way, a device was completed.

EXAMPLE 3

In the TFTs fabricated in accordance with the present invention, the width of the amorphous semiconductor region and the width of each offset region affect not only the OFF current but also the voltage-withstanding capability between the source and drain and the operating speed. Therefore, TFTs meeting the objective can be built by optimizing a parameter such as the thickness of the anodized film or the energy of implanted ions. However, it is generally impossible to adjust such parameters of individual TFTs formed on one substrate separately. For example, an actual circuit is required that TFTs operating at a low speed and withstanding high voltages and TFTs operating at a high speed and withstanding low voltages be formed on the same substrate. In accordance with the fundamental principle of the present invention, with increasing the width of each offset region or of the doped amorphous semiconductor region, the OFF current decreases and the resistance to voltage improves but the operating speed drops.

Figure 11A:
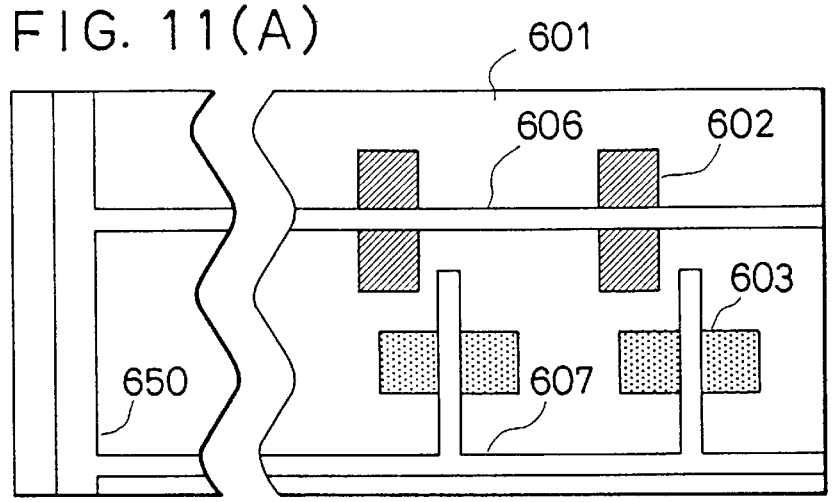
FIGS. 11(A) to 11(C) are plan views showing a method for forming a TFT in accordance with the present invention.
Figure 11B:
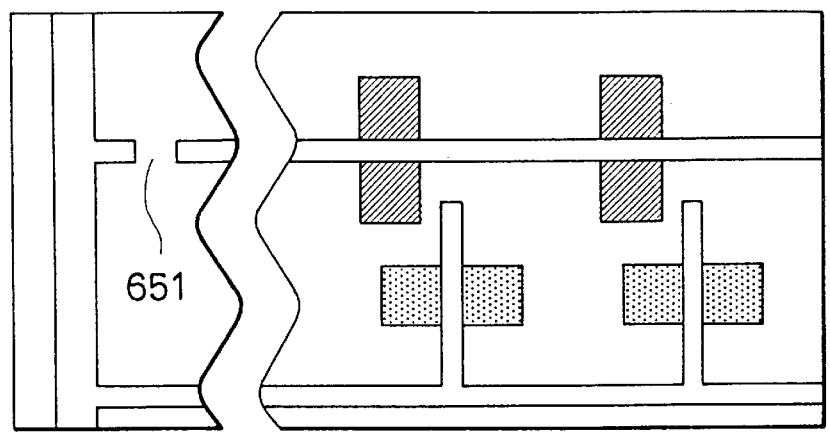
Figure 11C:
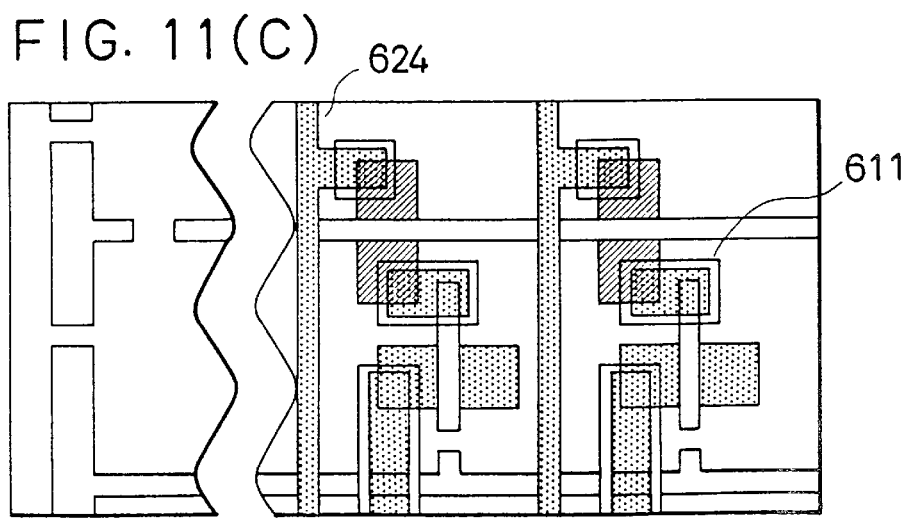
Figure 12A:
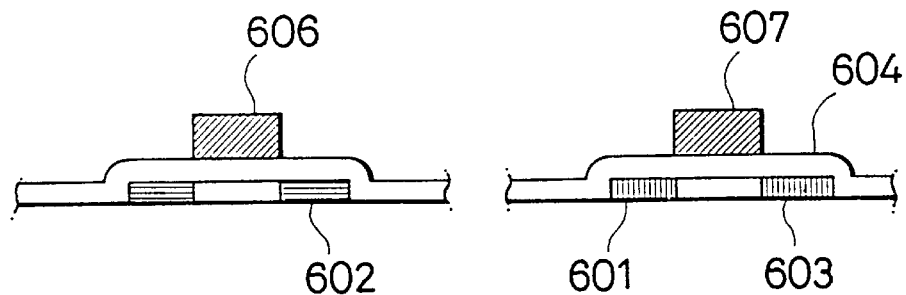
FIGS. 12, (A)–(D), are cross-sectional views of a thin-film transistor according to Example 6 of the invention, illustrating the sequence in which the device is fabricated.
Figure 12B:
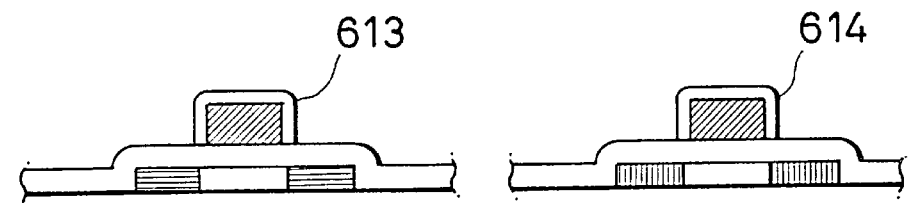
Figure 12C:
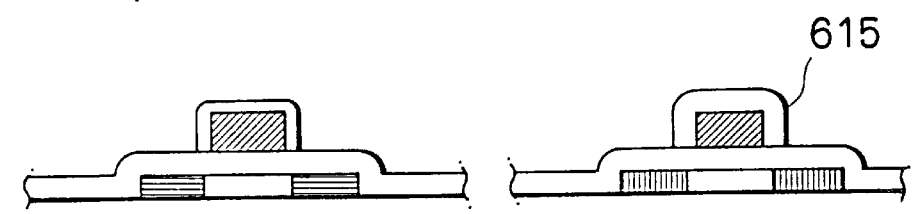
Figure 12D:
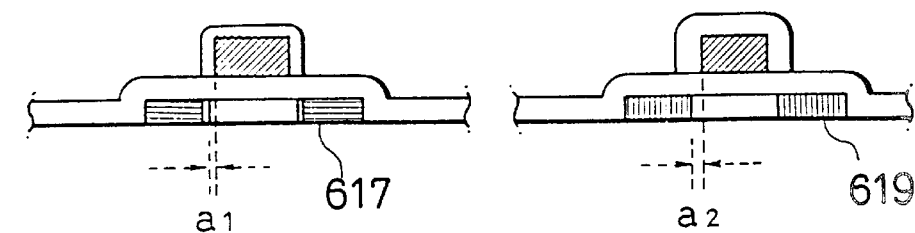

This example solves this problem and is next described by referring to the plan views of FIGS. 11, (A)–(C), and to the cross sections of FIGS. 12, (A)–(D). This example pertains to manufacture of a circuit used in an image display method using both a p-channel TFT and an n-channel TFT to activate one pixel, as described in Japanese Patent application Ser. No. 296331/1991. This n-channel TFT is required to operate at a high speed but suffices to withstand only low voltages. On the other hand, the p-channel TFT is not required to operate at a very high speed but its OFF current must be low. In some cases, it is necessary that the p-channel TFT withstand high voltages. Accordingly, the requirement is that the anodized film of the n-channel TFT be thin (20 to 100 nm) and that the anodized film of the p-channel TFT be thick (250 to 400 nm). Steps for manufacturing the present example are described below.

A substrate 601 was fabricated from Corning 7059 glass, in the same way as in Example 2. An n-type doped region 602, a p-type doped region 603, a gate-insulating film 604, gate electrodes 606 and 607, and its interconnects were formed. The gate electrodes 606 and 607 and its interconnects were connected with an interconnect 650 (FIGS 11(A) and 12(A)).

An electrical current was passed through the gate electrodes 606 and 607 and its interconnects. Films 613 and 614 of aluminum oxide were formed on the top and side surfaces of the gate electrodes 606 and 607 and its interconnects by anodization. The anodization was carried out similarly to Example 2 except that the maximum voltage was 50 V. The thickness of the anodized film fabricated in this step was about 60 nm (FIG. 12(B)).

Referring to FIG. 11(B), gate electrodes and their interconnects 606 were cut away from the interconnect 650 at 651 by laser etching. Under this condition, anodization was again initiated. The conditions were similar to the previous conditions except that the maximum voltage was increased to 250 V. Since no current flowed through the interconnect 606, no change was observed. However, an aluminum oxide film 615 having a thickness of about 300 nm was formed around the gate interconnects 607, because an electrical current flowed through the interconnects 607 (FIG. 12(C)).

Then, the laminate was laser annealed under the same conditions as in Example 2. In this case, in the n-channel TFT (on the left side of FIGS. 12. (A)–(D)), the width $a_1$ of the amorphous region and of the offset regions was so narrow that it could be neglected. Where the surface of the aluminum interconnects was not coated with an anodized film, the interconnects were severely damaged by laser illumination. Therefore, it was necessary to form an anodized film though it was thin. On the other hand, in the p-channel TFT (on the right side of FIG. 12), the thickness of the anodized film was 300 nm. Also, amorphous regions 150 to 200 nm thick existed. The width $a_2$ of the offset regions was estimated to be 100 to 150 nm (FIG. 12(D)).

In the same way as in Example 2, the aluminum interconnects were etched at requisite locations by laser irradiation within the atmosphere. The gate electrode of the p-channel TFT was separated from the interconnect 607. Also, the interconnect 650 was cut off. An interlayer insulating film was formed. Contact holes were formed. Interconnects 624 and 611 were formed. In this way, a circuit was formed.

In the circuit fabricated in this way, the offset regions and the amorphous region of the n-channel TFT were narrow. The speed of operation was excellent though the OFF current was slightly large. On the other hand, it was difficult to operate the p-channel TFT at a high speed. However, the OFF current was small. The ability to hold the electric charge stored in the pixel capacitor was excellent.

There exist other situations in which TFTs having different functions must be packed on one substrate. For example, in a liquid-crystal display driver, high-speed TFTs are required for the logic circuits including shift registers, whereas TFTs withstanding high voltages are required for the output circuit. The method of this example is effective in fabricating TFTs which must satisfy such conflicting requirements.

EXAMPLE 4

Figure 13:
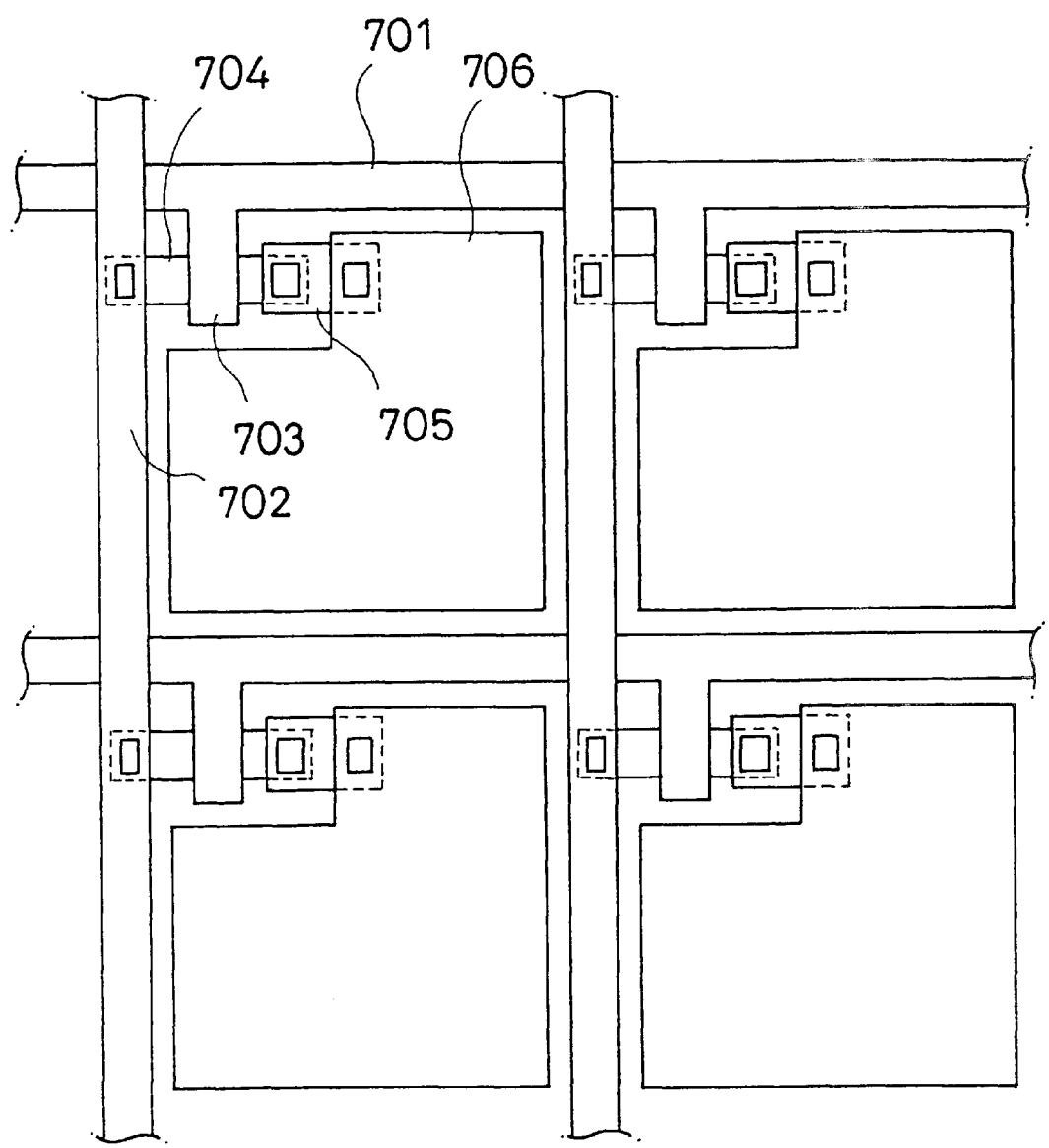
FIG. 13 is a plan view of an active-matrix liquid-crystal electro-optical device according to Example 6 of the invention.

An active-matrix circuit consisting of n-channel TFTs as shown in FIG. 13 was fabricated by the method used in Example 1. This active matrix comprised gate lines 701 and data lines 702 which were arranged in rows and columns. These lines were made of low-resistivity aluminum and coated with an aluminum oxide film having a thickness of 200 to 400 nm because the circuit underwent an anodization step according to the invention. The width of these lines was 2 $\mu$m. The thickness of these lines was 0.5 $\mu$m. Gate electrodes 703 of the TFTs for pixels were connected with the gate lines 701. The gate electrodes were also coated with aluminum oxide. A semiconductor layer 704 was formed under the gate electrodes. In the same way as the n-channel TFTs of Example 1, there existed n-type polycrystalline regions doped with phosphorus. With respect to offset regions which constitute one feature of the invention, their width was set to about 200 to 400 nm. The sources of this semiconductor layer were in contact with the data lines 702. The drains were connected via aluminum electrodes 705 with pixel electrodes 706 made of ITO.

FIG. 14 is a circuit diagram of an active-matrix device fabricated in the present example. As described previously, in the matrix circuit of this structure, it is known that when the charging of a capacitor $C_{LC}$ ends and the gate voltage ceases, the capacitor $C_{LC}$ is capacitively coupled to the gate line via the parasitic capacitance $C_{GD}$ of both gate and drain. The voltage drops by $\Delta V$ from the charging voltage. This phenomenon is also observed in a circuit in which n-channel and p-channel TFTs are connected in parallel. This is described in detail in Japanese Patent application Ser. No. 208648/1991 filed by the present applicant.

As shown in FIG. 14, in a circuit consisting of only one TFT, i.e., either an n-channel TFT or a p-channel TFT, the voltage drop is given by.

$$\Delta V = C_{GD} \cdot V_G / (C_{LC} + C_{GD})$$

where $V_G$ is the difference between the ON voltage and OFF voltage of the gate voltage. For example, in a TFT fabricated without using a self-aligning process, the parasitic capacitance $C_{GD}$ is quite large and so the voltage drop $\Delta V$ is also large. To solve this problem, a storage capacitor $C_{AD}$ was connected in parallel with the pixel capacitor as shown in FIG. 14 to increase the apparent capacitance of the pixel capacitor. However, this method does not fundamentally solve the problem. As described already, new problems such as a decrease in the aperture ratio are induced.

Even for devices fabricated by a self-aligning process, if the size of the pixels is so small that the effect of the parasitic capacitance of the TFTs compared with the pixel capacitance cannot be neglected, then this voltage drop poses a serious problem. For example, in a panel 3 inches in diagonal which is used for projection and matches high-definition television, the pixel capacitance is as small as 13 fF. On the other hand, where TFTs are fabricated by a process using 2 μm rules, the aspect ratio of the interconnects is large. As a result, even if no overlapping exists, parasitic capacitance is produced in three dimensions geometrically. The capacitance reaches several fF, which is 10% or more of the pixel capacitance.

An active-matrix circuit using conventional TFTs is shown in FIG. 14(A). Obviously, the correct display to be provided is impeded by the voltage drop $\Delta V$. Specifically, in order to operate TFTs at a high speed, the gate voltage must be higher than the drain voltage. Usually, a voltage about twice as high as the drain voltage is used as the gate voltage. Therefore, if the drain voltage is 5 V, the gate voltage is 10 V or more. Where the gate voltage is made negative in OFF state to perfect the operation of the TFTs, the gate voltage varies to a larger extent. In the case of FIG. 14, the drain voltage is alternating current of ±6 V. The gate voltage is +12 V in ON state and −4 V in OFF state. From the equation above, we have the relation $V_G=16$ V. If the parasitic capacitance is 2 fF, the voltage drop $\Delta V$ is 2 V, as shown in FIG. 14(A). This reaches indeed one third of the drain-charging voltage. Of course, the electric charge stored in the pixel is discharged by spontaneous discharge and, therefore, it is more difficult in practice to provide an ideal display. To avoid this problem, storage capacitors must be provided at the expense of the aperture ratio.

On the other hand, in accordance with the present invention, the parasitic capacitance can be reduced greatly. More specifically, the capacitance can be reduced below 0.1 fF. Therefore, the voltage drop $\Delta V$ can be almost neglected, as shown in FIG. 14(B). Furthermore, in accordance with the present invention, the OFF current is smaller than the OFF current of TFTs fabricated by the prior art method by about one order of magnitude. Consequently, the spontaneous discharge is much milder. Hence, an almost ideal display can be provided.

EXAMPLE 5

FIG. 15 shows an example of the present invention. A non-alkali glass such as Coning 7059 or quartz was utilized as a substrate. Other substrate material can be utilized, too. It is also desirable to cover the surface of the substrate with a material with good heat conductivity like aluminum nitride. In this example, anodic oxidation is performed in a latter process. During the oxidation, only the portion of anodic oxidation is heated. Because the usual glass substrate does not have high heat conductivity, it may result in peeling and other bad effects as a result of heat reserve. If a material with good heat conductivity such as aluminum nitride, aluminum oxide is utilized as a substrate, such things cannot happen.

A substrate silicon oxide layer 1102 was formed on a substrate 1101 by 200–2000 Å. Island crystal silicon films 1103 and 1104 were formed thereon. The thickness of this silicon film was 300–1500 Å. Here, 1103 was for high-speed operation TFTs, and 1104 was for low leak current TFTs. The former was appropriate for the purpose of an operational circuit, an image information process circuit, a shift register, and the like. The latter was appropriate for the purpose of an active matrix element of a liquid crystal display device.

The method of manufacturing the island crystal silicon is only briefly shown here. An amorphous silicon film was formed by a deposition method such as plasma CVD method or low-pressure CVD method. There are two methods for crystallizing. One method is a method of annealing at 500–650° C. for 2–48 hours. In this case, above mentioned amorphous silicon film must have thickness of 750 Å or more. A silicon oxide film of 100–1000 Å thickness was deposited on it as a cap film, and was annealed in an electric furnace. After this annealing, this was patterned into the island silicon film.

The other method is a method of crystallizing a silicon film momentarily by radiating a strong light energy like laser or flash lamp. In this case, it is appropriate the thickness of the amorphous silicon film is 750 Å or less. To prevent stress caused by different thermal expansions, the amorphous silicon film is crystallized by radiation of strong light energy like laser of flash lamp, without forming a cap film and the like.

In this way, after obtaining an island silicon film, a silicon oxide film 1105 was formed as a gate insulating film by 500–1500 Å on the whole surface. As a formation method of this silicon oxide film, a sputter method or a plasma CVD method was appropriate. If heat resistance of the substrate allowed, the silicon oxide film obtained by heat oxide method of the island silicon showed a very good characteristic. In the case of forming a silicon oxide film by plasma CVD method, a film with good step coverage was obtained by utilizing tetra.ethoxy.silane(TEOS). To improve the characteristic further, it is desirable to perform annealing in an inactive gas such as nitrogen or argon, at 450–550° C.

After that, a first wiring, that is, a wiring to be a gate wiring of TFTs was formed by a sputter method. Aluminum was utilized as a material of the wiring. Not only pure aluminum, but also aluminum including 0.5–2% silicon can be utilized. This aluminum was patterned and gate electrodes 1106 and 1107 were formed. In addition, all of the aluminum wirings formed here were connected. (FIG. 15(A))

Next, the substrate was dipped in an ethylene glycol solution of 1–5% tartaric acid(pH≈7.0), an aluminum wiring was connected to an anode, a platinum electrode was used as a cathode, and current was applied. Thus an anodic oxide was formed on the aluminum wiring. Here, oxidation was performed at first with applying constant current. When voltage was increased to a decided level, the voltage was kept at the decided level until current becomes 100 μA/cm² or less. In a condition with constant electric current of the first stage, the surface condition of the oxide film was greatly affected by the speed of voltage increase. Generally speaking, the faster the rising speed, the rougher the surface became. The amount of silicon included also affected the surface condition. In the opinion of this inventor, 2 V/minute or less for pure aluminum, 1.5 V/minute or less for aluminum including 2% silicon was appropriate. In this example, voltage was increased to be 100 V at a rate of 1.2 V/minute. As a result, an anodic oxide (aluminum oxide) with 1000 Å thickness 1108 and 1109 was obtained. (FIG. 15(B))

Figure 15A:
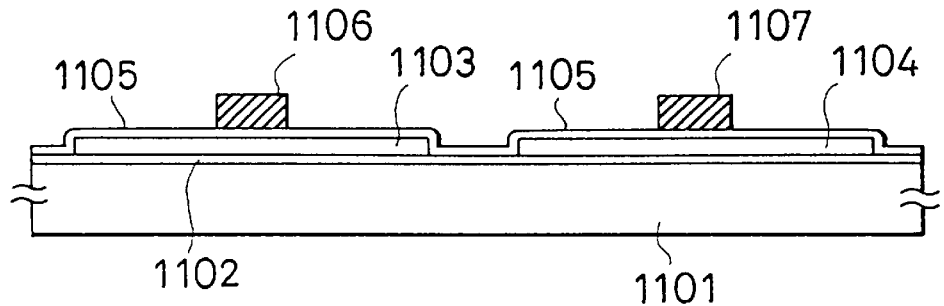
FIGS. 15(A)–(E) shows a manufacturing method in accordance with the present invention.
Figure 15B:
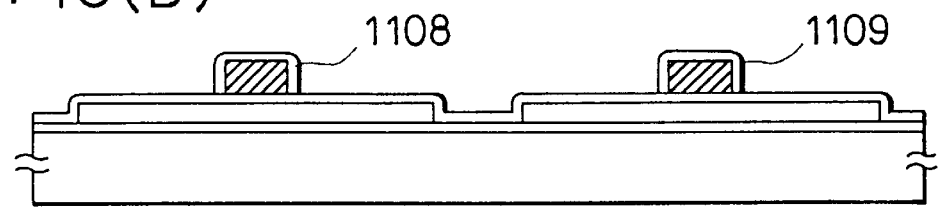
Figure 15C:
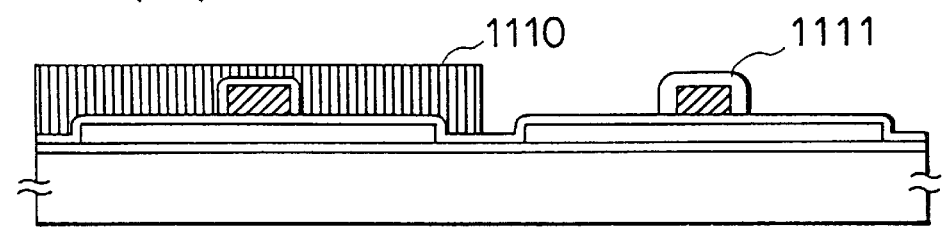

Next, a photoneece (UR3800 manufactured by Toray Co., Ltd.) was coated on the whole surface of the substrate by spin coater. The cycle of circulation was 2500 rpm. After it was dried in a nitrogen atmosphere at 80° C. for an hour, this photoneece was patterned by a usual exposing method. In this case, the portion on high-speed TFTs (on the left side of the figure) only was left. Finally, the photo varnish 1110 left in this way was made into polyimide by baking it at 300° C. for 0.5–2 hours. After that, by above mentioned anodic oxidation method, anodic oxidation was performed again. In this case, anodic oxidation does not proceed on the portion covered with the polyimide 1110. Therefore, as is shown in FIG. 15(C), anodic oxidation was effected in the wiring 1107 only. Here, applied voltage was increased to be 220 V. Therefore, a thick anodic oxide 1111 with 2500 Å thickness was formed around the wiring 1107. (FIG. 15(C))

Figure 15D:
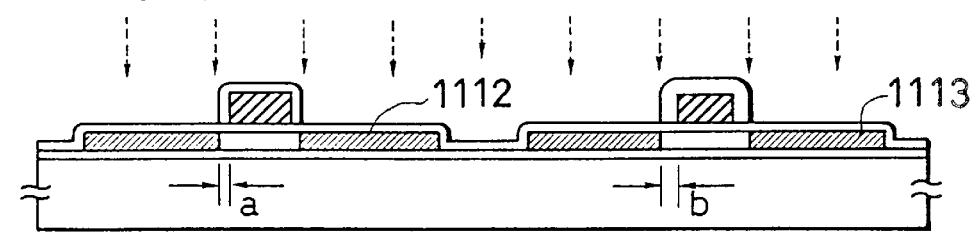
Figure 15E:
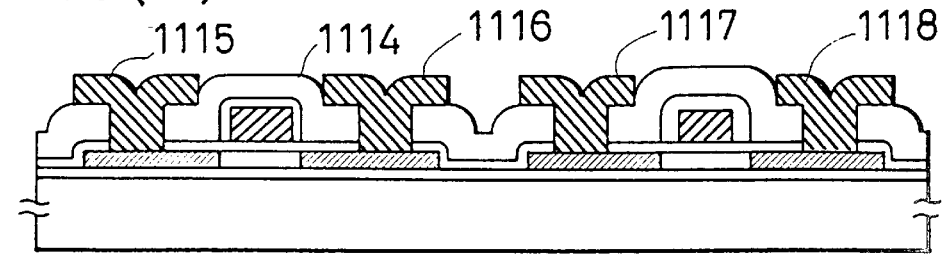

After that, an impurity (phosphorous or boron) was introduced into a silicon film in self-align way by ion injection method or plasma doping method, with the gate electrode and an oxide around it as a mask. Impurity regions 1112 and 1113 were formed. Here, the size of offset between the impurity region and the gate electrode was decided by the thickness of anodic oxide as is shown in FIG. 15(D). That is, because an anodic oxide 1108 was thin in the TFTs in the left part of the figure (for high-speed operation), offset a was small. On the other hand, because an anodic oxide 1111 was thick in the TFTs in the right part of the figure (for low leak current), offset b was big. That is, there is a relationship of a<b. (FIG. 15(D))

Then, to improve conductivity of the impurity region, a strong light energy such as laser or flash lamp was radiated and crystal character of the impurity region was made better. Furthermore, by a well known multilayer interconnection technology, a wiring of the second layer was formed. That is, as an interlayer insulator 1114, a silicon oxide film of 2000–6000 Å thickness was deposited by a plasma CVD method. A contact hole was formed there, and a metal film such as a multilayer film of titanium nitride (200–1000 Å thickness) and aluminum (500–5000 Å thickness) was deposited by a sputter method and the like. This was patterned, and electrodes•wirings 1115, 1116, 1117, and 1118 were formed. (FIG. 15(E))

In the circuit formed in this way, a shift register was formed by utilizing high-speed TFTs, and its operation of 6.2 MHz at a drain voltage of 10 V, and 11.5 MHz at 20 V was confirmed. On the other hand, mobility of low leak current TFTs was 50–110 cm$^2$/Vs for NMOS, but leak current was 10 fA or less in the condition of gate voltage of 0 V and drain voltage of 1 V, for NMOS.

EXAMPLE 6

FIG. 16 shows an example of the present invention. A non-alkali glass such as Coning 7059 or quartz was utilized as a substrate. Other substrate material can be utilized, too. It is also desirable to cover the surface of the substrate with a material with good heat conductivity like aluminum nitride, as was explained in Example 5. A substrate silicon oxide film 1202 was formed on a substrate 1201 by 200–2000 Å. An island crystal silicon film was 300–1500 Å. After obtaining the island silicon film, a silicon oxide film 1203 was formed as a gate insulating film on the whole surface by 500–1500 Å.

After that, a first wiring, that is, a wiring to be a gate wiring of TFTs was formed by a sputter method. Aluminum was utilized as a material of the wiring. Not only pure aluminum, but also aluminum including 0.5–2% silicon can be utilized. This aluminum was patterned and a gate electrode 1205 and a wiring 1206 in the same layer as the gate electrode 1205 were formed. (FIG. 16(A))

Next, the substrate was dipped in an ethylene glycol solution of 1–5% tartaric acid (pH=7.0), an aluminum wiring was connected to an anode, a platinum electrode was used as a cathode, and current was applied. Thus an anodic oxide was formed on the aluminum wiring. Here, an anodic oxide (aluminum oxide) with 1000 Å thickness 1207 and 1208 was obtained. (FIG. 16(B))

Figure 16A:
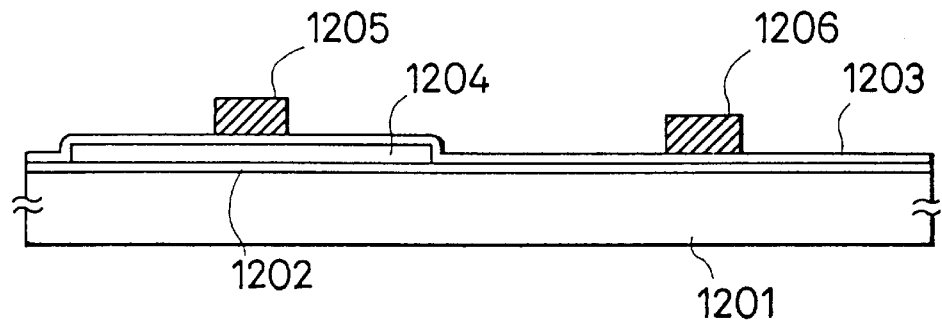
FIGS. 16(A)–(E) shows a manufacturing method in accordance with the present invention.
Figure 16B:
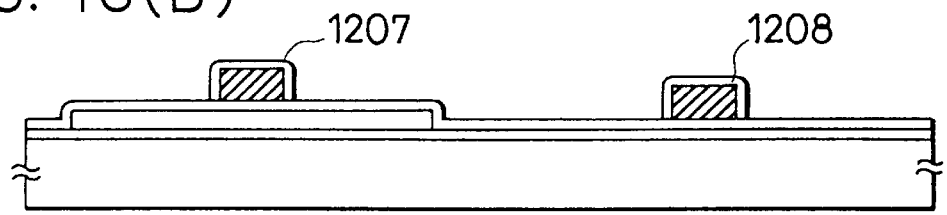
Figure 16C:
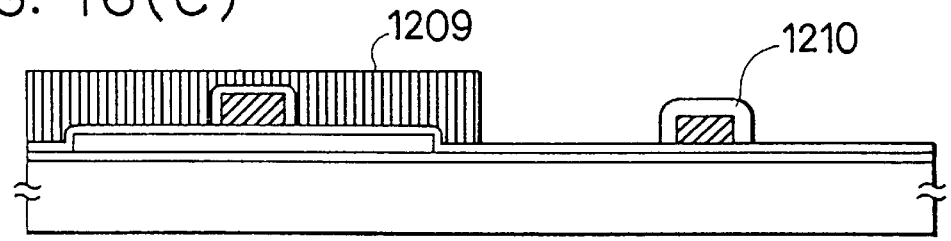

Next, a photoneece (UR3800 manufactured by Toray Co., Ltd.) was coated on the whole surface of the substrate by spin coater. After it was dried, this photoneece was patterned. In this case, the portion on TFTs (on the left side of the figure) only was left. Finally, the photoneece 1209 left in this way was made into polyimide by baking it at 300° C. for 0.5–2 hours. After that, by above mentioned anodic oxidation method, anodic oxidation was performed again. In this case, anodic oxidation does not proceed on the portion covered with the polyimide 1209. Therefore, as is shown in FIG. 16(C), anodic oxidation was effected in the wiring 1206 only. Here, applied voltage was increased to be 220 V. Therefore, a thick anodic oxide 1210 with 2500 Å thickness was formed around the wiring 1206. (FIG. 16(C))

Figure 16D:
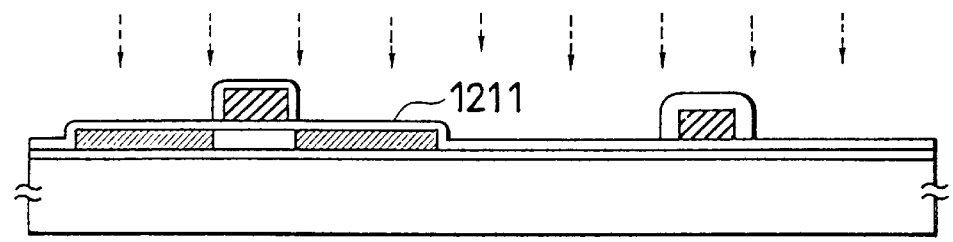
Figure 16E:
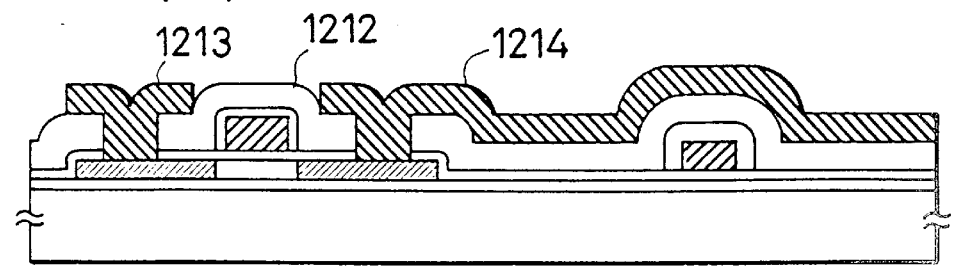

After that, an impurity (phosphorous or boron) was introduced into the silicon film in self-align way by ion injection method or plasma doping method, with the gate electrode and an oxide around it as a mask. An impurity region 1211 was formed. Here, the size of offset between the impurity region and the gate electrode is decided by the thickness of anodic oxide as is shown in FIG. 16(D). In this case, offset of approximately 1000 Å was formed. (FIG. 16(D))

Then, to improve conductivity of the impurity region, a strong light energy such as laser or flash lamp was radiated and crystal character of the impurity region was made better. Furthermore, by a well known multilayer interconnection technology, a wiring of the second layer was formed. That is, as an interlayer insulator 1212, a silicon oxide film of 2000–6000 Å thickness was deposited by a plasma CVD method. A contact hole was formed there, and a metal film such as a multilayer film of titanium nitride (200–1000 Å thickness) and aluminum (500–5000 Å thickness) was deposited by a sputter method and the like. This was patterned, and electrode-wirings 1213 and 1214 were formed. (FIG. 16(E))

As is shown in the figure, the wiring 1214 is crossed with the wiring 1206. At this crossing portion, not only the interlayer insulator 1212 but also an anodic oxide 1210 with high insularity existed. The anodic oxide formed around the wiring 1206 is thicker than the anodic oxide formed around the gate electrode 1205. It is expected that the anodic oxide 1210 shows enough insularity at an applied voltage of 200 V in the manufacturing process. On the other hand, because the thickness of an anodic oxide 1207 in the peripheral portion of the gate electrode of TFTs was approximately 1000 Å, this was not a problem for high-speed operation of the TFTs. Actually the mobility of the TFTs was 80–150 cm$^2$/Vs for NMOS.

EXAMPLE 7

FIG. 17 shows an example of the present invention. A non-alkali glass substrate such as Coning 7059 or quartz was utilized as a substrate. Other substrate material can be utilized, too. It is also desirable to cover the surface of the substrate with a material with good heat conductivity like aluminum nitride, as was explained in Example 5. A substrate silicon oxide film 1302 was formed on a substrate 1301 by 200–2000 Å. An island crystal silicon film 1303 was formed thereon. The thickness of this silicon film was 300–1500 Å. After obtaining the island silicon film, a silicon oxide film 1304 was formed on the whole surface by 500–1500 Å.

After that, a first wiring, that is, a wiring to be a gate wiring of TFTs was formed by a sputter method. Tantalum was utilized as a material of the wiring. Tantalum nitride can be also utilized in place of metal tantalum. A sputter method was utilized as a deposition method. This tantalum was patterned and a gate electrode 1305 and a wiring 1306 in the same layer as the gate electrode 1305 were formed. (FIG. 17(A))

Next, the substrate was dipped in an ethylene glycol solution of 1–5% citric acid (pH=7.0), a tantalum wiring was connected to an anode, a platinum electrode was used as a cathode, and current was applied. Thus an anodic oxide was formed on the tantalum wiring. Here, an anodic oxide (tantalum oxide) with 2000 Å thickness 1307 and 1308 was obtained. (FIG. 17(B))

Figure 17A:
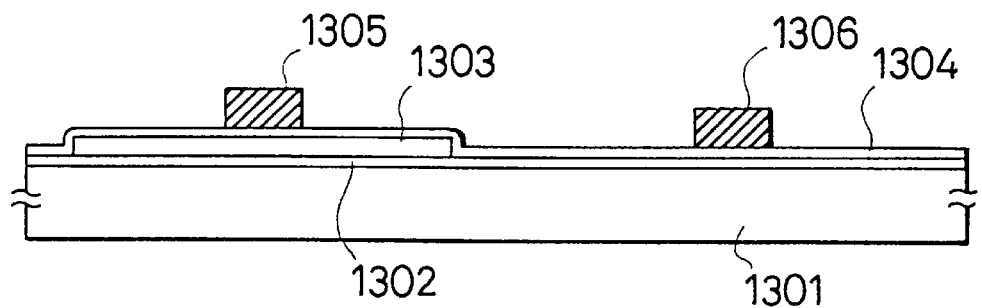
FIGS. 17(A)–(E) shows a manufacturing method in accordance with the present invention.
Figure 17B:
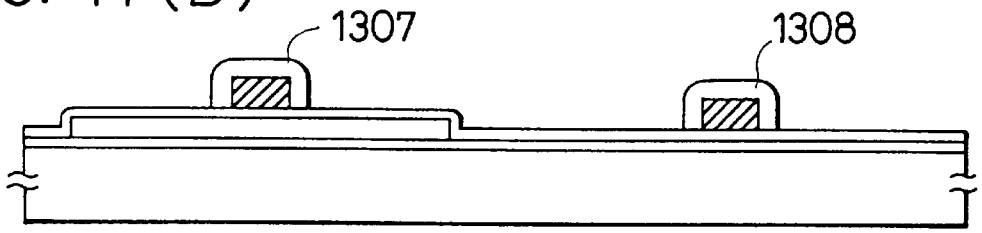
Figure 17C:
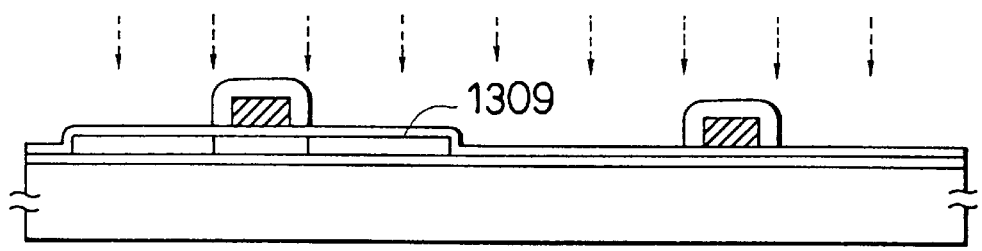
Figure 17D:
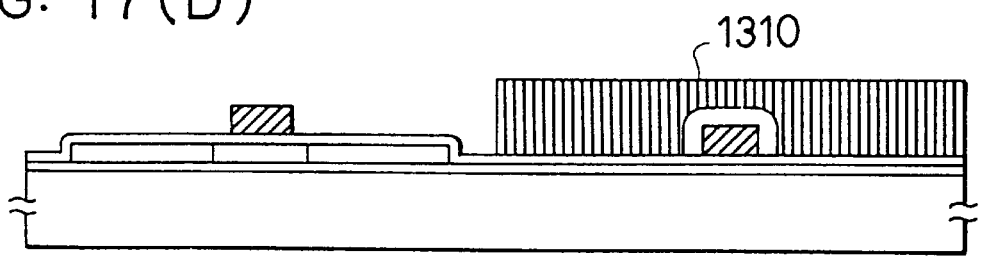
Figure 17E:
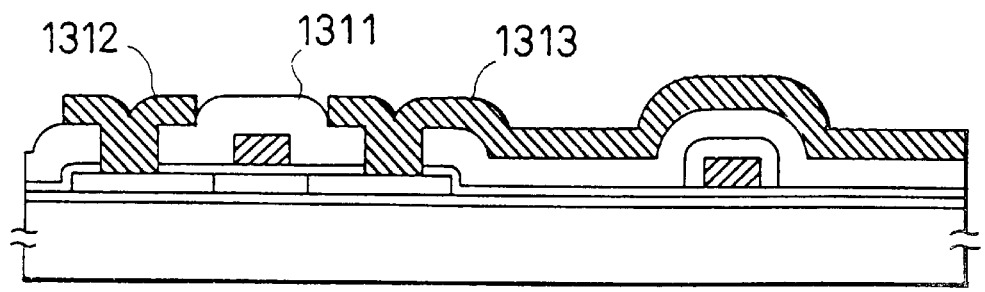

After that, an impurity (phosphorous or boron) was introduced into the silicon film in self-align way by ion injection method or plasma doping method, with the gate electrode and an oxide around it as a mask. An impurity region 1309 was formed. Here, the size of offset between the impurity region and the gate electrode is decided by the thickness of anodic oxide as is shown in FIG. 17(C). In this case, offset of approximately 2000 Å was formed. (FIG. 17(C))

Next, a photoneece was coated on the whole surface and patterned and made into polyimide. The photoneece only on the TFT (on the left side of the figure) was removed. With this photoneece 1310 left in this way as a mask, tantalum oxide was etched in a plasma atmosphere of carbon tetrafluoride and oxygen. Here, because the atmosphere gas included oxygen, the photo varnish was also etched, but if this was made in 1–5 µm thickness, it could bear until all anodic oxide 1307 was etched. Buffer hydrofluoric acid could be utilized for etching. In this case, though the photoneece is not etched, the gate oxide film, the substrate oxide film, and the substrate were etched. In this way, the anodic oxide 1307 of the gate electrode was etched by 1000 Å or more, preferably, all of it. (FIG. 17(D))

Then, to improve conductivity of the impurity region, a strong light energy such as laser or flash lamp was radiated and crystal character of the impurity region was made better. In Examples 5 and 6, because an anodic oxide exists, light energy was difficult to be radiated to the interface between an impurity region and an intrinsic semiconductor region (channel formation region). This sometimes caused a problem to reliability. However, in the condition removed with an anodic oxide like in this example, light energy was fully radiated to the interface, too, and enough reliability was obtained.

Furthermore, by a well known multilayer interconnection technology, a wiring of the second layer was formed. That is, as an interlayer insulator 1311, a silicon oxide film of 2000–6000 Å thickness was deposited by a plasma CVD method. A contact hole was formed there, and a metal film such as a multilayer film of titanium nitride (200–1000 Å thickness) and aluminum (500–5000 Å thickness) was deposited by a sputter method and the like. This was patterned, and electrode-wirings 1312 and 1313 were formed. (FIG. 17(E))

Like in Example 6, the wiring 1313 was crossed with the wiring 1306. At this crossed portion, not only the interlayer insulator 1311 but also an anodic oxide 1308 with high insularity existed. The portion showed enough insularity as a result.

EXAMPLE 8

Figure 18A:
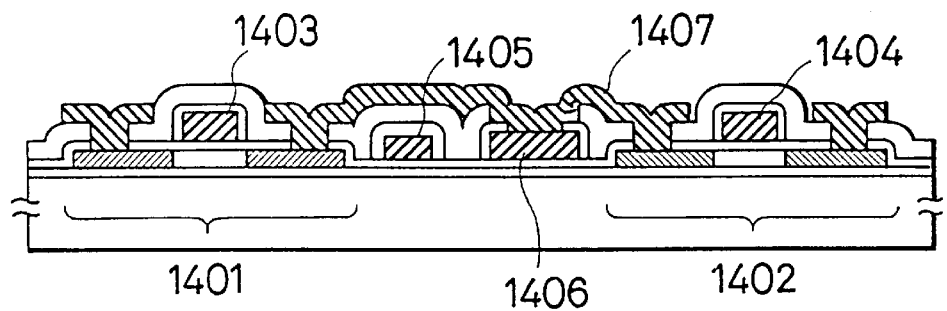
FIGS. 18(A)–(C) shows applicable examples of the present invention.

FIG. 18(A) shows an example of the present invention. This example was performed by utilizing technologies shown in Examples 5 to 7, and is an example of a CMOS circuit utilized for a driving circuit of a liquid crystal display and an image sensor. TFTs 1401 on the left of the figure is a PMOS, and TFTs 1402 on the right is an NMOS. Wirings of a first layer were 1403, 1404, 1405, and 1406. 1403 and 1404 were gate electrodes. The thickness of the anodic oxide of them is thin (~1000 Å), so as to be appropriate for high-speed TFTs. The anodic oxide of the wiring 1406 is thin (~1000 Å) in the same way as the gate electrodes to contact the 1407 being a wiring of a second layer. A contact hole is also formed. Either one of the methods shown in FIG. 19 to FIG. 21 can be adopted, but the method in FIG. 19 or FIG. 20 was easy to be performed. The anodic oxide of the wiring 1405 was thick (~2500 Å), because it was crossed with the wiring 1407 of the second layer, and enough insularity could be obtained.

EXAMPLE 9

Figure 18B:
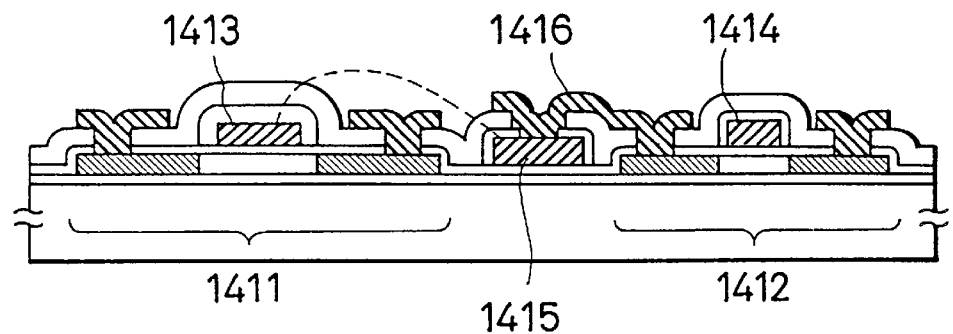

FIG. 18(B) shows an example of the present invention. This example was performed by utilizing technologies shown in Examples 5 to 7, and is an example of a peripheral circuit of a signal output utilized for a driving circuit of a liquid crystal display and an image sensor. TFTs 1411 in the left of the figure are TFTs to control strong electric current, and is typically a big one with a channel width of 500 µm–1 mm. TFTs 1412 in the right of the figure are TFTs for a logic circuit, and is typically a relatively small one with a channel width of 5–50 µm.

Wirings of a first layer were 1413, 1414, and 1415. 1413 and 1414 were gate electrodes. The thickness of the anodic oxide of 1414 is thin (~1000 Å), so as to be appropriate for high-speed TFTs. The anodic oxide of a gate electrode 1413 was thick (~3000 Å) because the TFTs 1411 were TFTs for high voltage and strong electric current. The anodic oxide of the wiring 1415 was thin (~1000 Å) in the same way as that of the gate electrode to contact the 1416 being a wiring of a second layer. A contact hole is also formed therein. Either one of the methods shown in FIG. 19 to FIG. 21 can be adopted, but the method in FIG. 19 or FIG. 20 was easy to be performed. The wiring 1415 was continued to the gate wiring 1413.

EXAMPLE 10

Figure 18C:
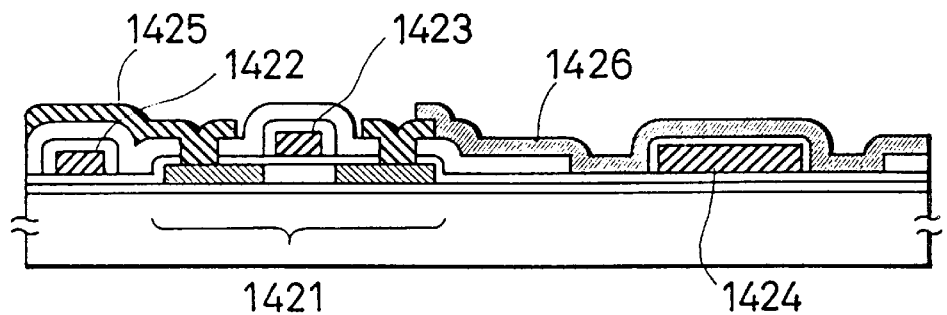
Figure 19A:
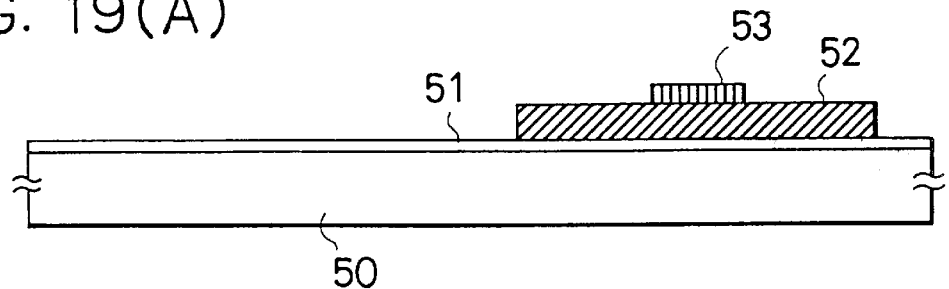
FIGS. 19(A)–(F) shows a manufacturing process of forming a contact in accordance with the present invention.
Figure 19B:
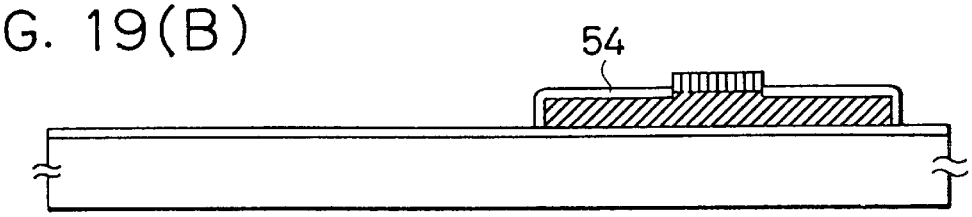
Figure 19C:
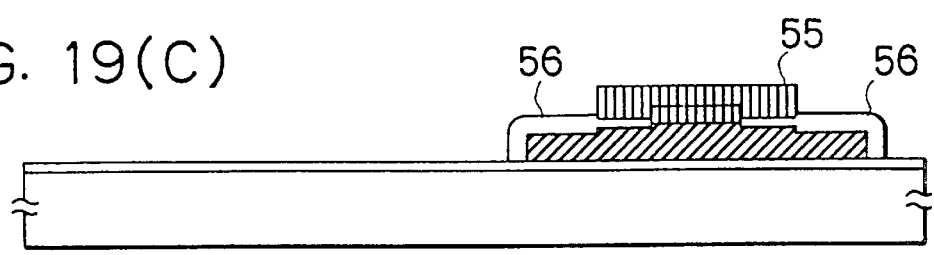
Figure 19D:
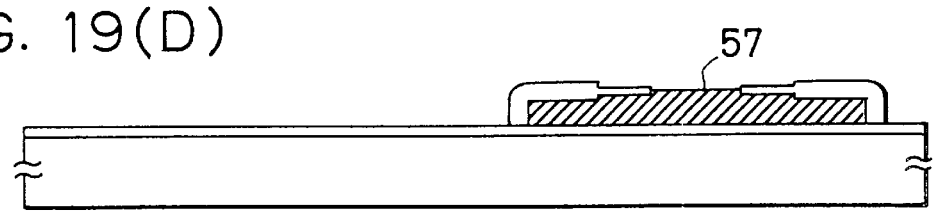
Figure 19E:
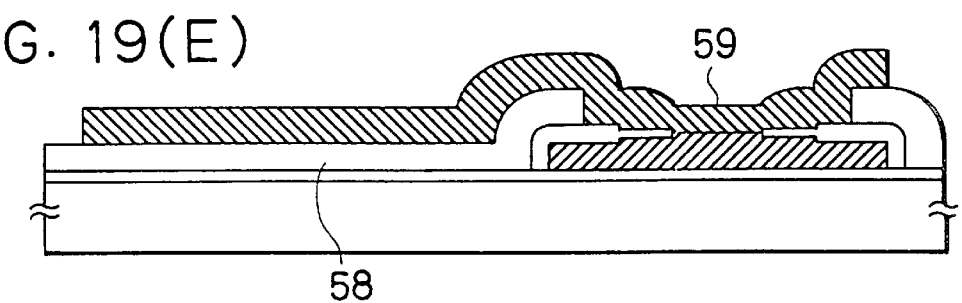
Figure 19F:
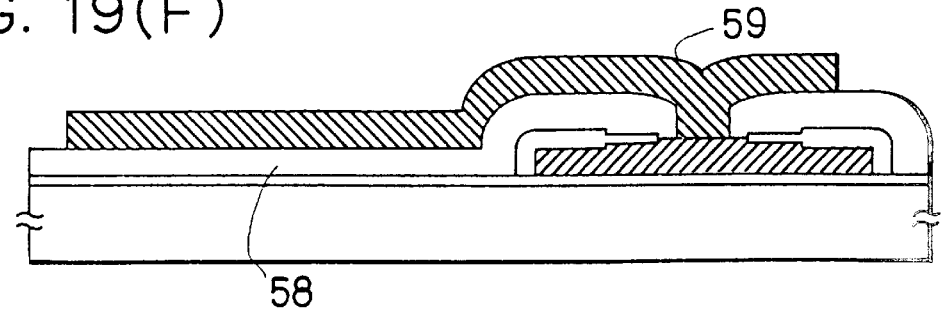
Figure 20A:
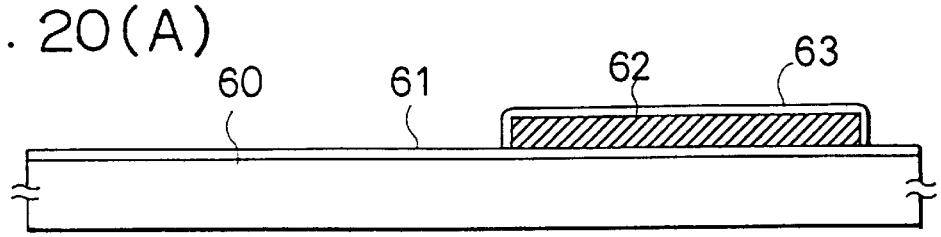
FIGS. 20(A)–(F) shows a manufacturing process of forming a contact in accordance with the present invention.
Figure 20B:
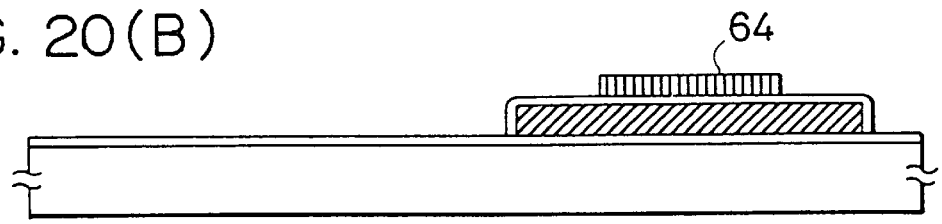
Figure 20C:
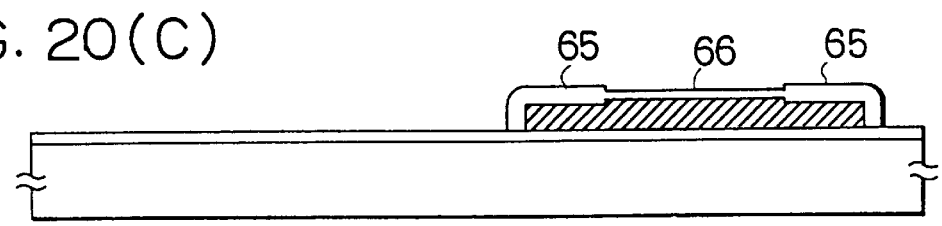
Figure 20D:
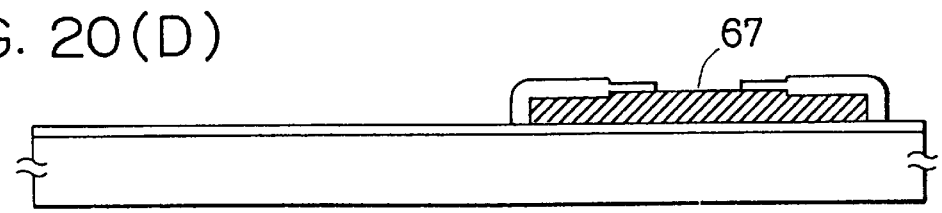
Figure 20E:
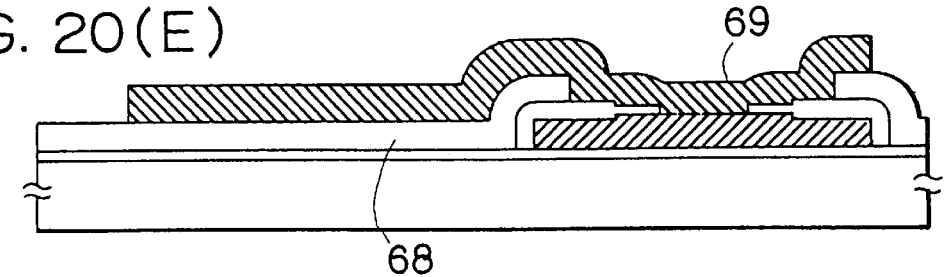
Figure 20F:
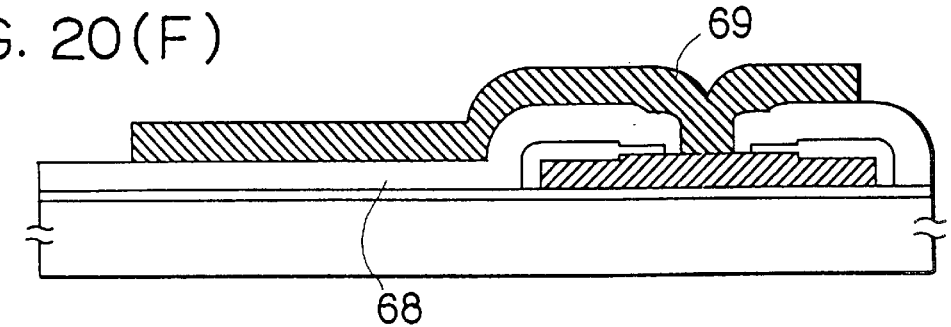
Figure 21A:
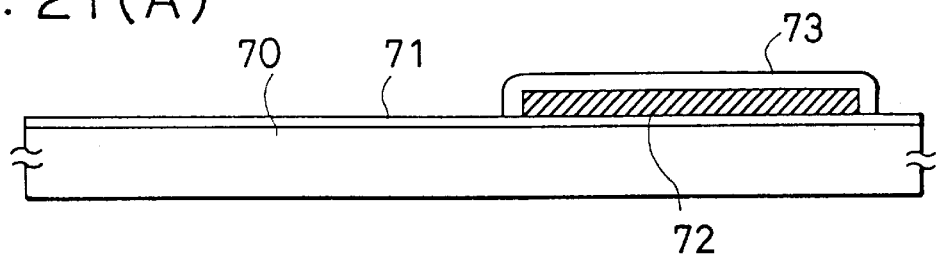
FIGS. 21(A)–(E) shows a manufacturing process of forming a contact in accordance with the present invention.
Figure 21B:
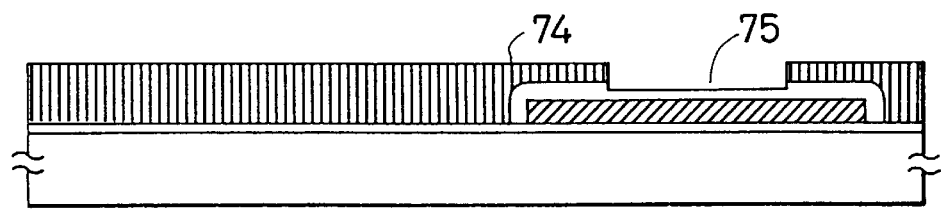
Figure 21C:
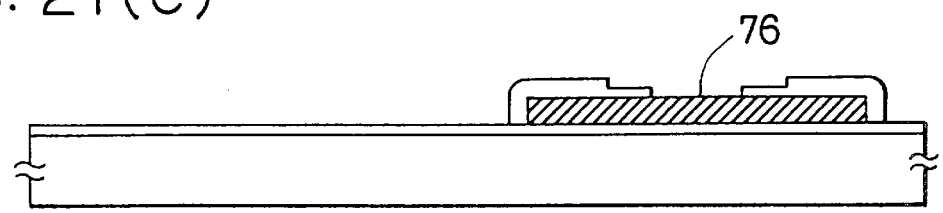
Figure 21D:
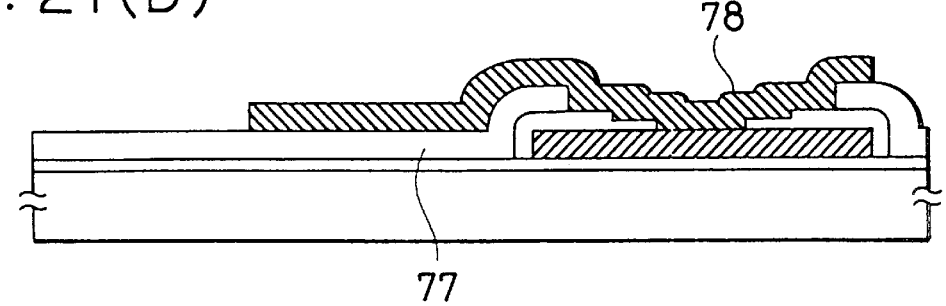
Figure 21E:
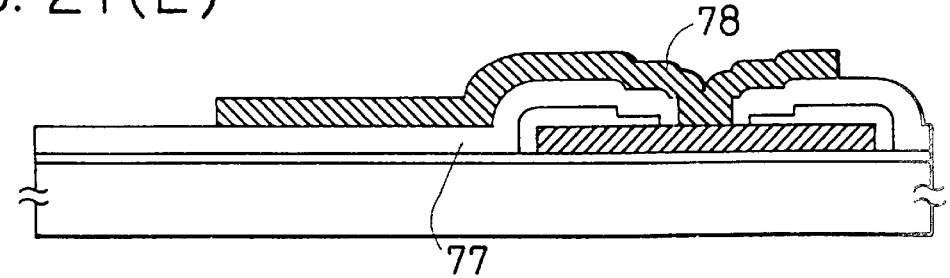
Figure 22A:
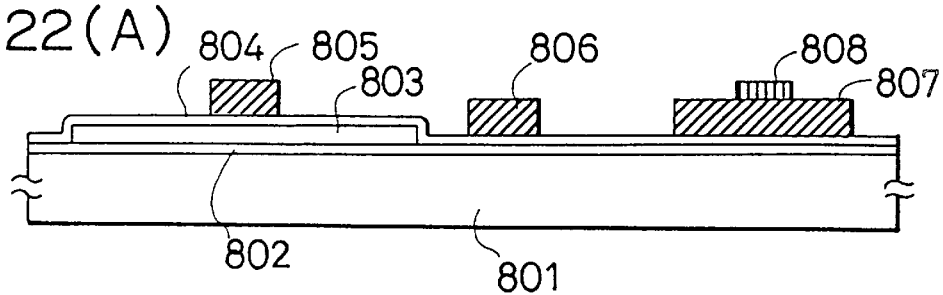
FIGS. 22(A)–(E) shows a manufacturing method in accordance with the present invention.
Figure 22B:
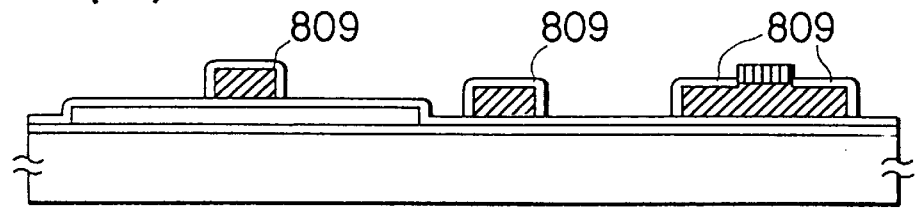
Figure 22C:
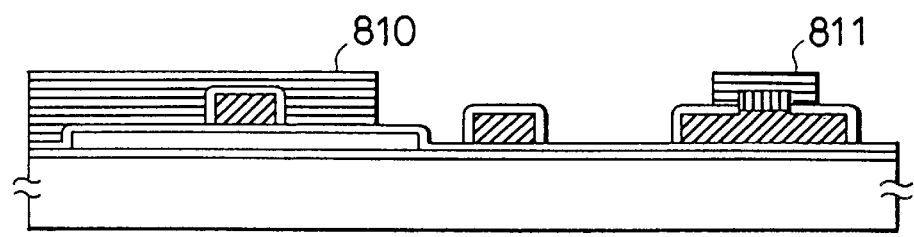
Figure 22D:
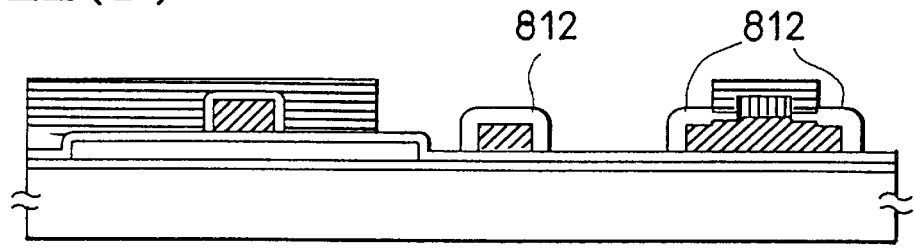
Figure 22E:
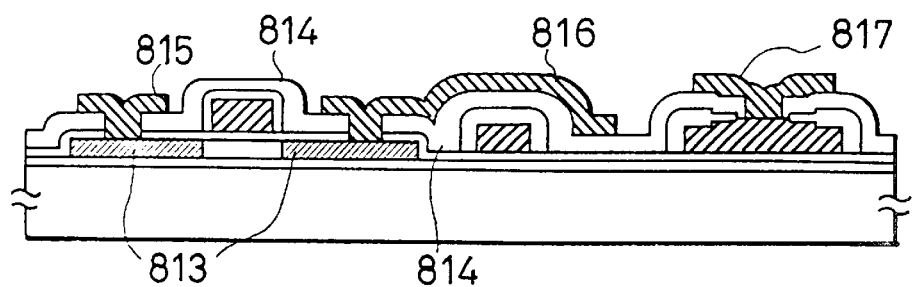
Figure 23A:
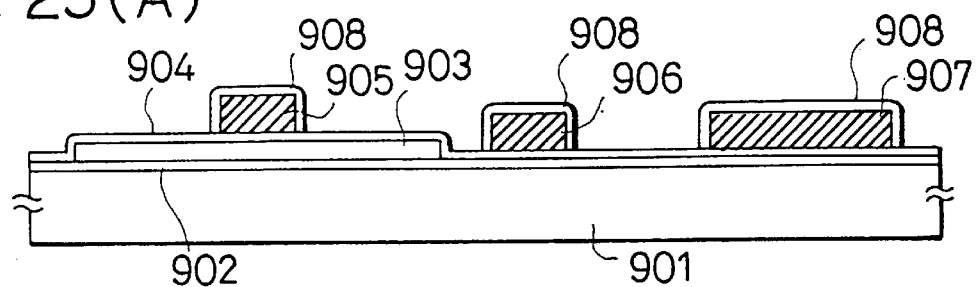
FIGS. 23(A)–(E) shows a manufacturing method in accordance with the present invention.
Figure 23B:
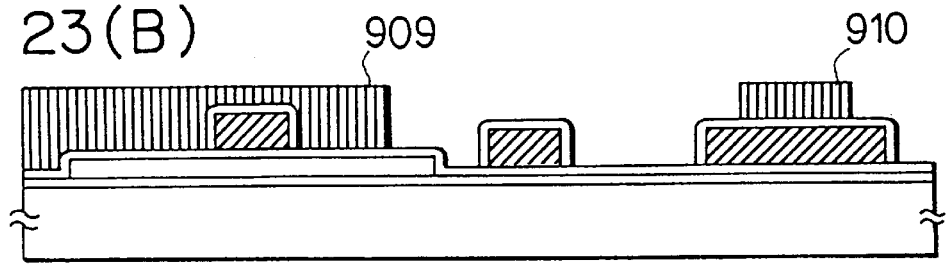
Figure 23C:
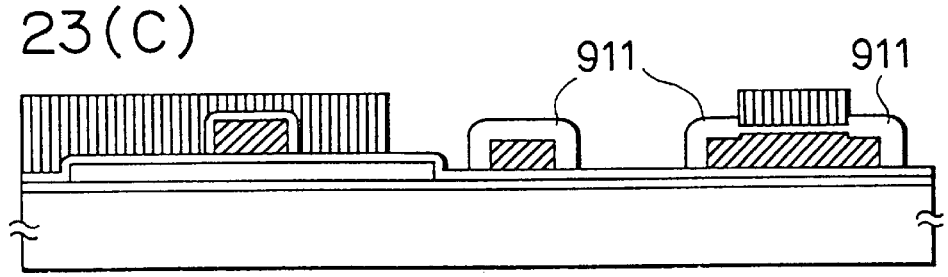
Figure 23D:
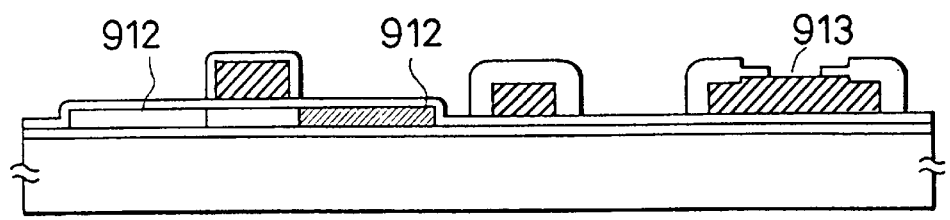
Figure 23E:
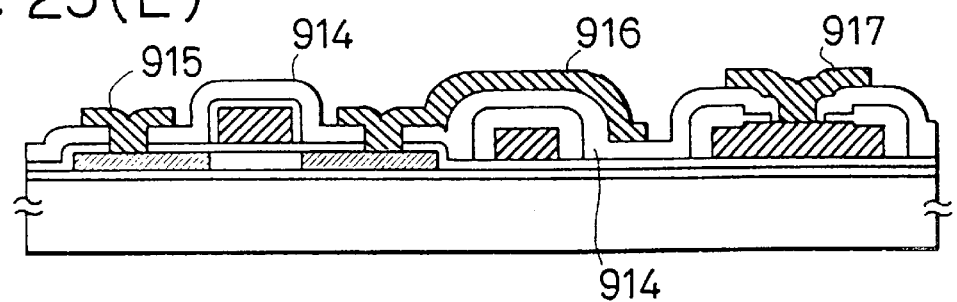

FIG. 18(C) shows an example fo the present invention. This example was performed by utilizing technologies shown in Examples 5 to 7, and is an example of a circuit around TFTs for controlling pixels of a liquid crystal display. TFTs 1421 in the figure are TFTs for low leak current. Wirings of a first layer were 1422, 1423, and 1424. 1423 was a gate electrode. The thickness of the anodic oxide of the gate electrodes 1423 was thick (~2000 Å), because low leak current was demanded for the TFTs 1421. The anodic oxide of the wiring 1422 was also thick (~2000 Å) to improve insularity, because it was crossed with a wiring 1425 of a second layer. The wiring 1424 constitutes a capacitor with a transparent conductive film extended from the drain of the TFTs. To improve electrostatic capacitance, an interlayer insulator was not provided between them, and a dielectric was only an anodic oxide (aluminum oxide). What is more, the thickness of it was as thin as 1000 Å.

EXAMPLE 11

FIG. 22 shows this example. This example relates to a technology of contacting a wiring to be anodic oxidized with an upper wiring. A substrate silicon oxide film 802 was deposited on a substrate 801 like quartz, Corning 7059. A crystal island silicon film 803 and a silicon oxide film 804 as a gate insulating film were deposited, and gate electrode•wiring 805, other wirings 806 and 807 were formed of aluminum. Because the wiring 807 must form a contact with an upper wiring, a mask material 808 was formed by photoneece. (FIG. 22(A))

Current was run through the wirings 805 to 807 in an electrolyte solution, and a thin (1000 Å thickness) anodic oxide (aluminum oxide) film 809 was formed on portions not being covered with the mask material. (FIG. 22(B))

After that, a gate electrode 805 of TFTs and the mask 808 of photoneece formed before were covered, and masks 810 and 811 were newly formed of photoneece. (FIG. 22(C))

Anodic oxidation was performed again, and a thick (2500 Å) anodic oxide 812 was formed on a portion not covered with the mask material. Around the place of a contact hole in the wiring 807, the thickness of the anodic oxide decreases in steps in the direction of the contact hole. (FIG. 22(D))

After that, an impurity region 813 was formed, and an interlayer insulator 814 was deposited. It was preferable the thickness of the interlayer insulator was 5000 Å or more to improve insularity, but because a thick anodic oxide was formed in the portion where wirings were crossed, thin thickness of 1000–3000 Å of the interlayer insulator was not a problem. This interlayer insulator was patterned, and a contact hole was formed to the source, drain of TFTs, and the wiring 807. A metal film was deposited further, and by patterning this, metal wirings 815, 816, and 817 were formed. Here, the wiring 817 contacted the wiring 807 in the lower part. The upper wiring 817 was not easily cut, because different levels were gradually formed around the contact hole, and because the thickness of the interlayer insulator was thinner than that of usual cases. On the other hand, the wiring 816 was crossed with the wiring 806. Because a thick anodic oxide 812 was formed in the portion where wirings were crossed, this and the interlayer insulator gave enough insularity.

EXAMPLE 12

FIG. 23 shows this example. This example relates to a technology of contacting a wiring to be anodic oxidized with an upper wiring. A substrate silicon oxide film 902 was deposited on a substrate 901 like quartz, Corning 7059. A crystal island silicon film 903 and a silicon oxide film 904 as a gate insulating film were deposited, and a gate electrode•wiring 905, other wirings 906 and 907 were formed of aluminum. Current was run through the wirings in an electrolyte solution, and a thin (1000 Å thickness) anodic oxide (aluminum oxide) film 908 was formed on the surface. (FIG. 23(A))

After that, a gate electrode 905 of TFTs and the portion of the wiring 907 to which a contact hole is to be provided were covered, and masks 909 and 910 were formed of photoneece. (FIG. 23(B))

Anodic oxidation was performed again, and a thick (2500 Å) anodic oxide 911 was formed on a portion not covered with the mask material. (FIG. 23(C))

The masks 909 and 910 were removed, an impurity region 912 was formed, and a contact hole of a thin anodic oxide film 908 was formed on the wiring 907. (FIG. 23(D))

An interlayer insulator 914 was deposited and patterned. A contact hole was formed on the source, drain of TFTs, and the wiring 907. A metal film was deposited further, and by patterning this, metal wirings 915, 916, and 917 were formed. Here, the wiring 917 contacted the wiring 907 in the lower part. The upper wiring 917 was not easily cut, because different levels were gradually formed around the contact hole. On the other hand, the wiring 916 was crossed with the wiring 906 Because a thick anodic oxide 911 was formed in the portion where wirings were crossed, this and the interlayer insulator gave enough insularity.

The effect of the present invention is, first of all, MIS transistors with different characters can be formed on the same substrate in a process. As is clear from Example 5, to make two kinds of TFTs, just the following two processes should be added:

(i) Coating of photoneece and patterning thereof (ii) Second anodic oxidation

Photolithography process which decides yield is only (i), so that decrease of yield was little.

The second effect of the present invention is, as is shown in Example 6, a short circuit at the portion where wirings are crossed is decreased very much. Further, characteristic of an MIS transistor is kept. (For example, high-speed operation.) This is performed just by adding above (i) and (ii) processes, too, and contributed to improvement of yield.

The third effect of the present invention is shown in FIG. 19 to FIG. 21 and a sentence corresponding to them. The thickness of the anodic oxide is changed in steps near the contact of the wiring in the first layer and the wiring in the second layer. Thus different levels made by the contact hole are leveled, and cutting of the wiring of the second layer and the like are prevented.

Further, in accordance with the present invention, an insulating, anodized layer is formed at the surface of a gate electrode. As a result, the channel length is larger than the length of the gate electrode taken in the longitudinal direction of the channel. Hence, offset regions which receive no or very weak electric field from the gate electrode are formed on opposite sides of the channel region. Similarly, a doped amorphous semiconductor region having the same advantages can be formed. This reduces the leakage current in reverse bias. In consequence, capacitance which would have been heretofore needed to hold electric charge is dispensed with. The aperture ratio which has been approximately 20% in the prior art technique can be improved above 35%. Thus, display can be provided at higher quality.

In accordance with the present invention, the offset regions and the doped amorphous semidconductor region are determined by the thickness of the anodized film of the gate electrode. Therefore, the width of these regions can be controlled accurately to between 10 to 100 nm. We did not observe a great reduction in the production yield when this manufacturing step was added. Also, any factor which might be regarded as a cause of a decrease in the production yield did not existed.

While silicon semiconductor devices have been chiefly described thus far, it is obvious that the invention can be applied to semiconductor devices using germanium, silicon carbide, gallium arsenide, or other material.

What is claimed is:

1. An active matrix display device comprising:

a substrate having an insulating surface;

an active matrix circuit over said substrate, said active matrix circuit comprising:

at least one thin film transistor having source and drain regions and a channel region therebetween in a semiconductor film, and a gate electrode adjacent to said channel region with a gate insulating film interposed therebetween;

a pixel electrode formed over said substrate and electrically connected to one of said source and drain regions;

a capacitor formed between a wiring and a portion of said pixel electrode with an oxide film interposed therebetween, said oxide film comprising an oxidized surface of said wiring; and a CMOS circuit for driving said active matrix circuit formed over said substrate, said CMOS circuit comprising at least a pair of N-channel and P-channel thin film transistors.

2. An active matrix display device according to claim 1 wherein at least one of said wiring and said gate electrode comprises a material selected from the group consisting of silicon, aluminum, tantalum, titanium, tungsten, molybdenum, an alloy thereof, tantalum nitride, titanium nitride, tungsten nitride and molybdenum nitride.

3. An active matrix circuit according to claim 1 wherein said oxide film is formed by anodic oxidation.

4. An active matrix display device comprising:

a substrate having an insulting surface;

an active matrix circuit over said substrate, said matrix circuit comprising:

at least one thin film transistor having source and drain regions and a channel region therebetween in a semiconductor film, and a gate electrode adjacent to said channel region with a gate insulting film interposed therebetween;

a pixel electrode formed over said substrate and electrically connected to one of said source and drain regions;

a capacitor formed between a wiring and a portion of said pixel electrode with an oxide film interposed therebetween, said oxide film comprising an oxidized surface of said wiring; and a peripheral circuit of a signal output utilized for a driving circuit of said active matrix display device, said peripheral circuit comprising at least a first thin film transistor for controlling strong electric current and a second thin film transistor for a logic circuit.

5. An active matrix display device according to claim 4 wherein at least one of said wiring and said gate electrode comprises a material selected from the group consisting of silicon, aluminum, tantalum, titanium, tungsten, molybdenum, an alloy thereof, tantalum nitride, titanium nitride, tungsten nitride and molybdenum nitride.

6. An active matrix circuit according to claim 4 wherein said oxide film is formed by anodic oxidation.

7. An active matrix display device comprising:

a substrate having an insulating surface;

an active matrix circuit over said substrate, said active matrix circuit comprising:

at least one thin film transistor having source and drain regions and a channel region therebetween in a semiconductor film, and a gate electrode over said channel region with a gate insulating film interposed therebetween;

a pixel electrode formed over said substrate and electrically connected to one of said source and drain regions;

a capacitor formed between a wiring and a portion of said pixel electrode with an oxide film interposed therebetween, said oxide film comprising an oxidized surface of said wiring; and a CMOS circuit for driving said active matrix circuit formed over said substrate, said CMOS circuit comprising at least a pair of N-channel and P-channel thin film transistors.

8. An active matrix display device according to claim 7 wherein at least one of said wiring and said gate electrode comprises a material selected from the group consisting of silicon, aluminum, tantalum, titanium, tungsten, molybdenum, an alloy thereof, tantalum nitride, titanium nitride, tungsten nitride and molybdenum nitride.

9. An active matrix circuit according to claim 7 wherein said oxide film is formed by anodic oxidation.

10. An active matrix display device comprising:

a substrate having an insulating surface;

an active matrix circuit over said substrate, said active matrix circuit comprising:

at least one thin film transistor having source and drain regions and a channel region therebetween in a semiconductor film, and a gate electrode over said channel region with a gate insulating film interposed therebetween;

a pixel electrode formed over said substrate and electrically connected to one of said source and drain regions;

a capacitor formed between a wiring and a portion of said pixel electrode with an oxide film interposed therebetween, said oxide film comprising an oxidized surface of said wiring; and a peripheral circuit of a signal output utilized for a driving circuit of said active matrix display device, said peripheral circuit comprising at least a first thin film transistor for controlling strong electric current and a second thin film transistor for a logic circuit.

11. An active matrix display device according to claim 10 wherein at least one of said wiring and said gate electrode comprises a material selected from the group consisting of silicon, aluminum, tantalum, titanium, tungsten, molybdenum, an alloy thereof, tantalum nitride, titanium nitride, tungsten nitride and molybdenum nitride.

12. An active matrix circuit according to claim 10 wherein said oxide film is formed by anodic oxidation.

13. An active matrix display device comprising:

a substrate having an insulating surface;

an active matrix circuit over said substrate, said active matrix circuit comprising:

at least one thin film transistor having source and drain regions and a channel region therebetween in a semiconductor film comprising crystalline silicon, and a gate electrode adjacent to said channel region with a gate insulating film interposed therebetween;

a transparent conductive film formed over said substrate and electrically connected to one of said source and drain regions;

a capacitor formed between a wiring and a portion of said transparent conductive film with an oxide film interposed therebetween, said oxide film comprising an oxidized surface of said wiring; and a CMOS circuit for driving said active matrix circuit formed over said substrate, said CMOS circuit comprising at least a pair of N-channel and P-channel thin film transistors.

14. An active matrix display device according to claim 13 wherein at least one of said wiring and said gate electrode comprises a material selected from the group consisting of silicon, aluminum, tantalum, titanium, tungsten, molybdenum, an alloy thereof, tantalum nitride, titanium nitride, tungsten nitride and molybdenum nitride.

15. an active matrix circuit according to claim 13 wherein said oxide film is formed by anodic oxidation.

16. An active matrix display device comprising:
a substrate having an insulating surface;
an active matrix circuit over said substrate, said active matrix circuit comprising:
at least one thin film transistor having source and drain regions and a channel region therebetween in a semiconductor film comprising crystalline silicon, and a gate electrode adjacent to said channel region with a gate insulating film interposed therebetween;
a transparent conductive film formed over said substrate and electrically connected to one of said source and drain regions;
a capacitor formed between a wiring and a portion of said transparent conductive film with an oxide film interposed therebetween, said oxide film comprising an oxidized surface of said wiring; and
a peripheral circuit of a signal output utilized for a driving circuit fo said active matrix display device, said peripheral circuit comprising at least a first thin film transistor for controlling strong electric current and a second thin film transistor for a logic circuit.

17. An active matrix display device according to claim 16 wherein at least one of said wiring and said gate electrode comprises a material selected from the group consisting of silicon, aluminum, tantalum, titanium, tungsten, molybdenum, an alloy thereof, tantalum nitride, titanium nitride, tungsten nitride and molybdenum nitride.

18. An active matrix circuit according to claim 16 wherein said oxide film is formed by anodic oxidation.

19. An active matrix display device comprising:
a substrate having an insulating surface;
an active matrix circuit over said substrate, said active matrix circuit comprising:
at least one thin film transistor having source and drain regions and a channel region therebetween in a semiconductor film, and a gate electrode adjacent to said channel region with a gate insulating film interposed therebetween;
a pixel electrode formed over said substrate and electrically connected to one of said source and drain regions;
a capacitor formed between a wiring and a portion of said pixel electrode with an anodic oxide film interposed therebetween, said anodic oxide film comprising an oxidized surface of said wiring; and
a CMOS circuit for driving said active matrix circuit formed over said substrate, said CMOS circuit comprising at least a pair of N-channel and P-channel thin film transistors.

20. An active matrix display device according to claim 19 wherein at least one of said wiring and said gate electrode comprises a material selected from the group consisting of silicon, aluminum, tantalum, titanium, tungsten, molybdenum, an alloy thereo, tantalum nitride, titanium nitride, tungsten nitride and moylbdenum nitride.

21. An active matrix display device comprising:
a substrate having an insulating surface;
an active matrix circuit over said substrate, said active matrix circuit comprising:
at least one thin film transistor having source and drain regions and a channel region therebetween within a semiconductor film, and a gate electrode adjacent to said channel region with a gate insulating film interposed therebetween.
a pixel electrode formed over said substrate and electrically connected to one of said source and drain regions;
a capacitor formed between a wiring and a portion of said pixel electrode with an anodic oxide film interposed therebetween, said anodic oxide film comprising an oxidized surface of said wiring; and
a peripheral circuit of a signal output utilized for a driving circuit of said active matrix display device, said peripheral circuit comprising at least a first thin film transistor for controlling strong electric current and a second thin film transistor for a logic circuit.

22. An active matrix display device according to claim 21 wherein at least one of said wiring and said gate electrode comprises a material selected from the group consisting of silicon, aluminum, tantalum, titanium, tungsten, moylbdenum, an alloy thereof, tantalum nitride, titanium nitride, tungsten nitride and moylbdenum nitride.

23. An active matrix display device comprising:
a substrate having an insulating surface;
an active matrix circuit over said substrate, said active matrix circuit comprising;
at least one thin film transistor having source and drain regions and a channel region therebetween in a semiconductor film, and a gate electrode adjacent to said channel region with a gate insulating film interposed therebetween;
a pixel electrode formed over said substrate and electrically connected to one of said source and drain regions;
a capacitor formed between a wiring and a portion of said pixel electrode with an oxide film interposed therebetween, said oxide film comprising an oxidized surface of said wiring;
wherein said oxide film has a thickness less than 1000 Å; and
a CMOS circuit for driving said active matrix circuit formed over said substrate, said CMOS circuit comprising at least a pair of N-channel and P-channel thin film transistors.

24. An active matrix display device according to claim 23 wherein at least one of said wiring and said gate electrode comprises a material selected from the group consisting of silicon, aluminum, tantalum, titanium, tungsten, moylbdenum, an alloy thereof, tantalum nitride, titanium nitride, tungsten nitride and molybdenum nitride.

25. An active matrix circuit according to claim 23 wherein said oxide film is formed by anodic oxidation.

26. An active matrix display device comprising:
a substrate having an insulating surface;
an active matrix circuit over said substrate, said active matrix circuit comprising:
at least one thin film transistor having source and drain regions and a channel region therebetween in a semiconductor film, and a gate electrode adjacent to said channel region with a gate insulating film interposed therebetween;
a pixel electrode formed over said substrate and electrically connected to one of said source and drain regions;
a capacitor formed between a wiring and a portion fo said pixel electrode with an oxide film interposed therebetween, said oxide film comprising an oxidized surface of said wiring;

wherein said oxide film has a thickness less than 1000 Å; and a peripheral circuit of a signal output utilized for a driving circuit of said active matrix display device, said peripheral circuit comprising at least a first thin film transistor for controlling strong electric current and a second thin film transistor for a logic circuit.

27. An active matrix display device according to claim 26 wherein at least one of said wiring and said gate electrode comprises a material selected from the group consisting of silicon, aluminum, tantalum, titanium, tungsten, molybdenum, an alloy thereof, tantalum nitride, titanium nitride, tungsten nitride and molybdenum nitride.

28. An active matrix circuit according to claim 26 wherein said oxide film is formed by anodic oxidation.

29. An active matrix display device according to claim 1 wherein said oxide film has a thickness less than 1000 Å.

30. An active matrix display device according to claim 4 wherein said oxide film has a thickness less than 1000 Å.

31. An active matrix display device according to claim 7 wherein said oxide film has a thickness less than 1000 Å.

32. An active matrix display device according to claim 10 wherein said oxide film has a thickness less than 1000 Å.

33. An active matrix display device according to claim 13 wherein said oxide film has a thickness less than 1000 Å.

34. An active matrix display device according to claim 16 wherein said oxide film has a thickness less than 1000 Å.

35. An active matrix display device according to claim 19 wherein said anodic oxide film has a thickness less than 1000 Å.

36. An active matrix display device according to claim 21 wherein said anodic oxide film has a thickness less than 1000 Å.

37. An active matrix display device according to claim 1 wherein said pixel electrode comprises a conductive transparent oxide film.

38. An active matrix display device according to claim 4 wherein said pixel electrode comprises a conductive transparent oxide film.

39. An active matrix display device according to claim 7 wherein said pixel electrode comprises a conductive transparent oxide film.

40. An active matrix display device according to claim 10 wherein said pixel electrode comprises a conductive transparent oxide film.

41. An active matrix display device according to claim 19 wherein said pixel electrode comprises a conductive transparent oxide film.

42. An active matrix display according to claim 21 wherein said pixel electrode comprises a conductive transparent oxide film.

43. An active matrix display device according to claim 23 wherein said pixel electrode comprises a conductive transparent oxide film.

44. An active matrix display device according to claim 26 wherein said pixel electrode comprises a conductive transparent oxide film.

* * * * *